(12) United States Patent
Kim et al.

(10) Patent No.: US 11,948,872 B2
(45) Date of Patent: Apr. 2, 2024

(54) SEMICONDUCTOR PACKAGE AND METHOD OF FABRICATING THE SAME

(71) Applicant: Samsung Electronics Co., Ltd., Suwon-si (KR)

(72) Inventors: Jongyoun Kim, Seoul (KR); Minjun Bae, Hwaseong-si (KR); Hyeonseok Lee, Anyang-si (KR); Gwangjae Jeon, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 339 days.

(21) Appl. No.: 17/509,224

(22) Filed: Oct. 25, 2021

(65) Prior Publication Data

US 2022/0310496 A1   Sep. 29, 2022

(30) Foreign Application Priority Data

Mar. 23, 2021 (KR) ........................ 10-2021-0037518

(51) Int. Cl.
| | | |
|---|---|---|
| H01L 23/00 | (2006.01) | |
| H01L 23/31 | (2006.01) | |
| H01L 23/498 | (2006.01) | |
| H01L 25/18 | (2023.01) | |
| H01L 23/34 | (2006.01) | |

(52) U.S. Cl.
CPC .... *H01L 23/49811* (2013.01); *H01L 23/3128* (2013.01); *H01L 23/49822* (2013.01); *H01L 24/16* (2013.01); *H01L 25/18* (2013.01); *H01L 23/34* (2013.01); *H01L 24/73* (2013.01); (Continued)

(58) Field of Classification Search
CPC ........... H01L 23/49811; H01L 23/3128; H01L 23/49822; H01L 24/16; H01L 25/18; H01L 23/34; H01L 24/73; H01L 2224/16227; H01L 2224/73204; H01L 21/568; H01L 21/6835; H01L 23/49816; H01L 23/367; H01L 23/5383; H01L 25/0655; H01L 25/105; H01L 2221/68345; H01L 2224/81005; H01L 2924/15311; H01L 23/5384; H01L 23/5389; H01L 23/49827; H01L 25/0652
See application file for complete search history.

(56) References Cited

U.S. PATENT DOCUMENTS 6,734,568 B2   5/2004   Matsuo et al.
6,884,650 B2   4/2005   Lee et al.
(Continued)

*Primary Examiner* — Elias Ullah
(74) *Attorney, Agent, or Firm* — Harness, Dickey & Pierce, P.L.C.

(57) ABSTRACT

Disclosed are semiconductor packages and their fabricating methods. The semiconductor package comprises a redistribution substrate, a semiconductor chip on a top surface of the redistribution substrate, and a solder terminal on a bottom surface of the redistribution substrate. The redistribution substrate includes an under-bump pattern in contact with the solder terminal, a dielectric layer on a sidewall of the under-bump pattern, an under-bump seed pattern between the dielectric layer and the sidewall of the under-bump pattern, and a redistribution pattern on the under-bump pattern. The under-bump pattern has central and edge regions. A first top surface at the edge region of the under-bump pattern is at a level higher than that of a second top surface at the central region of the under-bump pattern. An angle between the bottom surface and the sidewall of the under-bump pattern is in a range of 110° to 140°.

20 Claims, 21 Drawing Sheets

(52) U.S. Cl.
CPC .............. *H01L 2224/16227* (2013.01); *H01L 2224/73204* (2013.01)

(56) References Cited

U.S. PATENT DOCUMENTS

| | | |
|---|---|---|
| 7,682,960 B2 | 3/2010 | Wen |
| 10,276,516 B2 | 4/2019 | Lin et al. |
| 10,290,604 B2 | 5/2019 | Huang et al. |
| 10,374,142 B2 | 8/2019 | Ajima et al. |
| 2009/0091028 A1 | 4/2009 | Lin et al. |
| 2020/0083201 A1 | 3/2020 | Suk et al. |
| 2021/0111114 A1 | 4/2021 | Lee et al. |

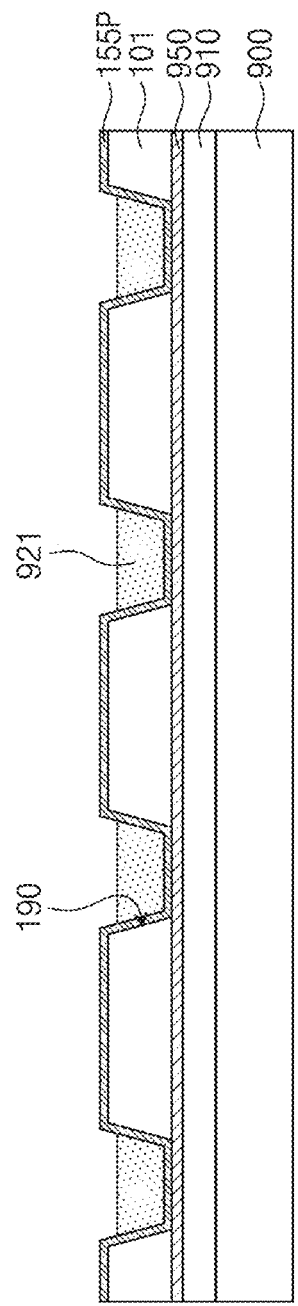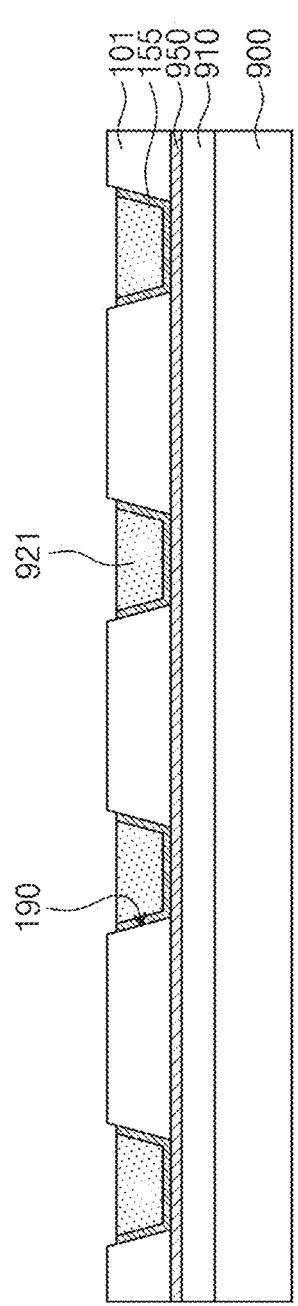

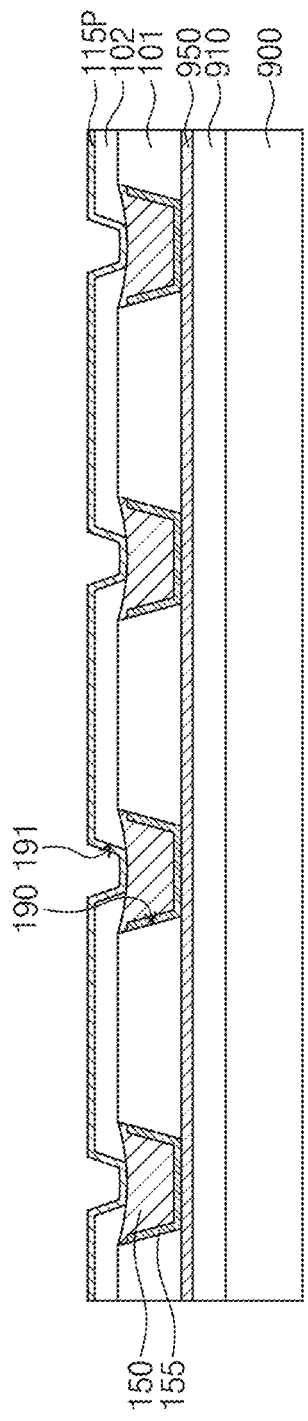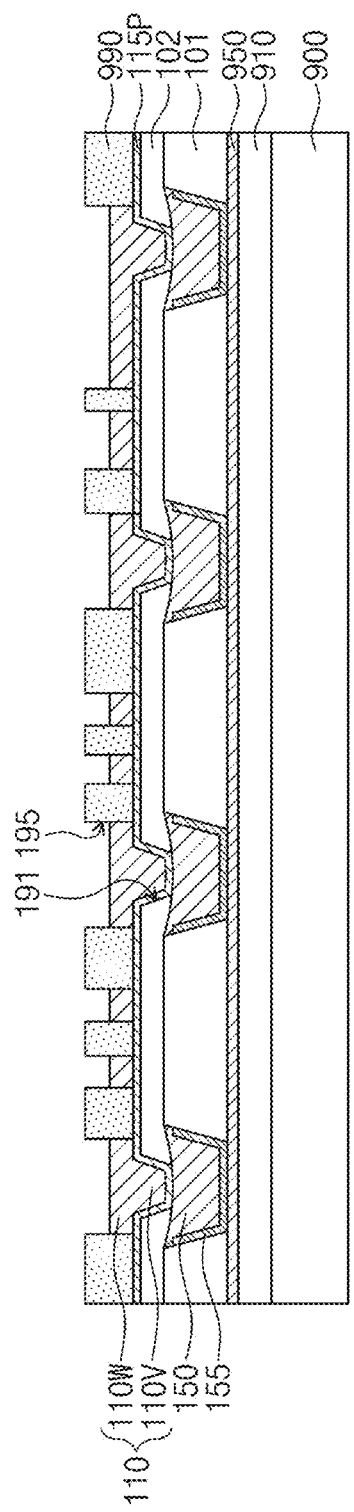

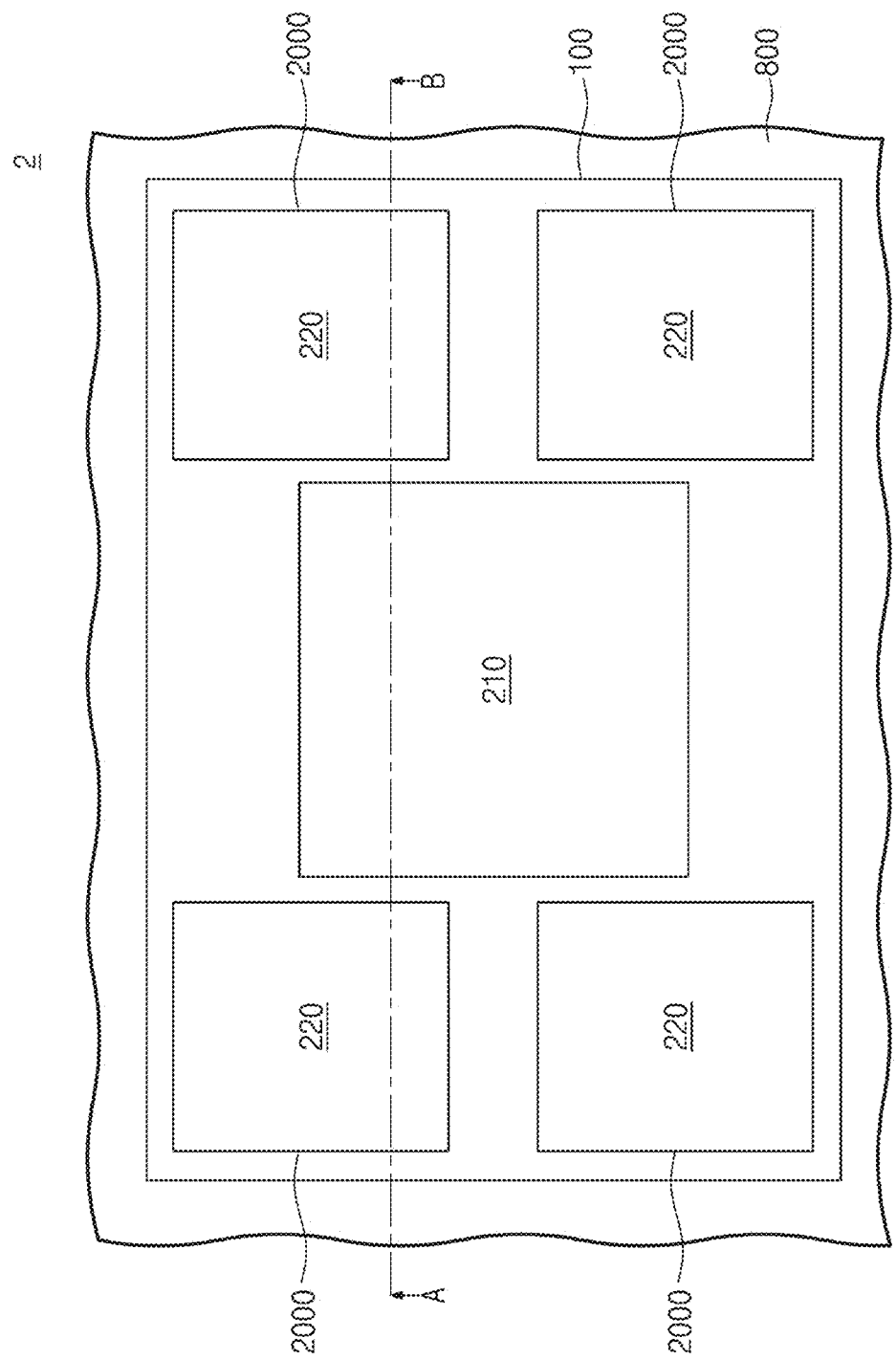

SEMICONDUCTOR PACKAGE AND METHOD OF FABRICATING THE SAME

CROSS-REFERENCE TO RELATED APPLICATION

This U.S. nonprovisional application claims priority under 35 U.S.C. § 119 to Korean Patent Application No. 10-2021-0037518 filed on Mar. 23, 2021 in the Korean Intellectual Property Office, the disclosure of which is hereby incorporated by reference in its entirety.

BACKGROUND

The present inventive concepts relate to a semiconductor package, and more particularly, to a semiconductor package including a redistribution substrate and a method of fabricating the same.

A semiconductor package is provided to implement an integrated circuit chip to qualify for use in electronic products. Typically, a semiconductor package is configured such that a semiconductor chip is mounted on a printed circuit board (PCB) and bonding wires or bumps are used to electrically connect the semiconductor chip to the printed circuit board. With the development of electronic industry, various researches have been conducted to improve reliability and durability of semiconductor packages.

SUMMARY

Some example embodiments of the present inventive concepts provide a semiconductor package with increased reliability and a method of fabricating the same.

According to some example embodiments of the present inventive concepts, a semiconductor package may comprise: a redistribution substrate; a semiconductor chip on a top surface of the redistribution substrate; and a solder terminal on a bottom surface of the redistribution substrate. The redistribution substrate may include: an under-bump pattern in contact with the solder terminal; a dielectric layer on a sidewall of the under-bump pattern; an under-bump seed pattern between the dielectric layer and the sidewall of the under-bump pattern, the under-bump seed pattern exposing a bottom surface of the under-bump pattern; and a redistribution pattern on the under-bump pattern. The under-bump pattern may have a central region and an edge region when viewed in plan. A first top surface of the under-bump pattern at the edge region of the under-bump pattern may be at a level higher than a level of a second top surface of the under-bump pattern at the central region of the under-bump pattern. An angle between the bottom surface and the sidewall of the under-bump pattern may be in a range of 110° to 140°.

According to some example embodiments of the present inventive concepts, a semiconductor package may comprise: a redistribution substrate; a semiconductor chip on a top surface of the redistribution substrate; and a solder terminal on a bottom surface of the redistribution substrate. The redistribution substrate may include: an under-bump pattern; a dielectric layer on a sidewall of the under-bump pattern; an under-bump seed pattern between the dielectric layer and the sidewall of the under-bump pattern; and a redistribution pattern on a top surface of the under-bump pattern. The solder terminal may be on a bottom surface of the under-bump pattern. The bottom surface of the under-bump pattern may be at a level higher than a level of a bottom surface of the dielectric layer. A first angle between the bottom surface and the sidewall of the under-bump pattern may be an obtuse angle. The under-bump seed pattern may not extend onto any of a top surface of the dielectric layer and the bottom surface of the under-bump pattern.

According to some example embodiments of the present inventive concepts, a semiconductor package may comprise: a redistribution substrate; a first semiconductor chip on a top surface of the redistribution substrate; a plurality of bumps between the redistribution substrate and the first semiconductor chip; and a solder terminal on a bottom surface of the redistribution substrate. The redistribution substrate may include: an under-bump pattern; a dielectric layer on a sidewall of the under-bump pattern; an under-bump seed pattern between the dielectric layer and the sidewall of the under-bump pattern, the under-bump seed pattern exposing a bottom surface of the under-bump pattern; a first redistribution pattern on the under-bump pattern, the first redistribution pattern including a first via part and a first wiring part, the first via part being between the under-bump pattern and the first wiring part; and a second redistribution pattern on the first redistribution pattern, the second redistribution pattern including a second via part and a second wiring part. A thickness of the under-bump pattern may be greater than a thickness of the first wiring part and a thickness of the second wiring part. The under-bump pattern may have a central region and an edge region when viewed in plan. A first top surface at the edge region of the under-bump pattern may be at a level higher than a level of a second top surface at the central region of the under-bump pattern. The bottom surface of the under-bump pattern may be at a level higher than a level of a bottom surface of the dielectric layer. An angle between the bottom surface of the under-bump pattern and the sidewall of the under-bump pattern may be in a range of 110° to 140°. The solder terminal may be on the bottom surface of the under-bump pattern. The under-bump pattern may not extend onto a top surface of the dielectric layer.

According to some example embodiments of the present inventive concepts, a method of fabricating a semiconductor package may comprise: coating a photosensitive polymer on a carrier substrate to form a dielectric layer; forming an opening in the dielectric layer; forming an under-bump seed layer on the dielectric layer and on a bottom surface and a sidewall of the opening; forming a first resist pattern in the opening, the first resist pattern exposing a portion of the under-bump seed layer, the portion of the under-bump seed layer being on a top surface of the dielectric layer; and etching the exposed portion of the under-bump seed layer to form an under-bump seed pattern. The step of forming the under-bump seed pattern may include exposing the top surface of the dielectric layer.

BRIEF DESCRIPTION OF THE DRAWINGS

FIGS. 2A, 2B, 2D to 2I, and 2K to 2R illustrate cross-sectional views showing a method of fabricating a semiconductor package according to some example embodiments.

FIG. 3A illustrates a plan view showing a semiconductor package according to some example embodiments.

DETAILED DESCRIPTION

Figure 1A:
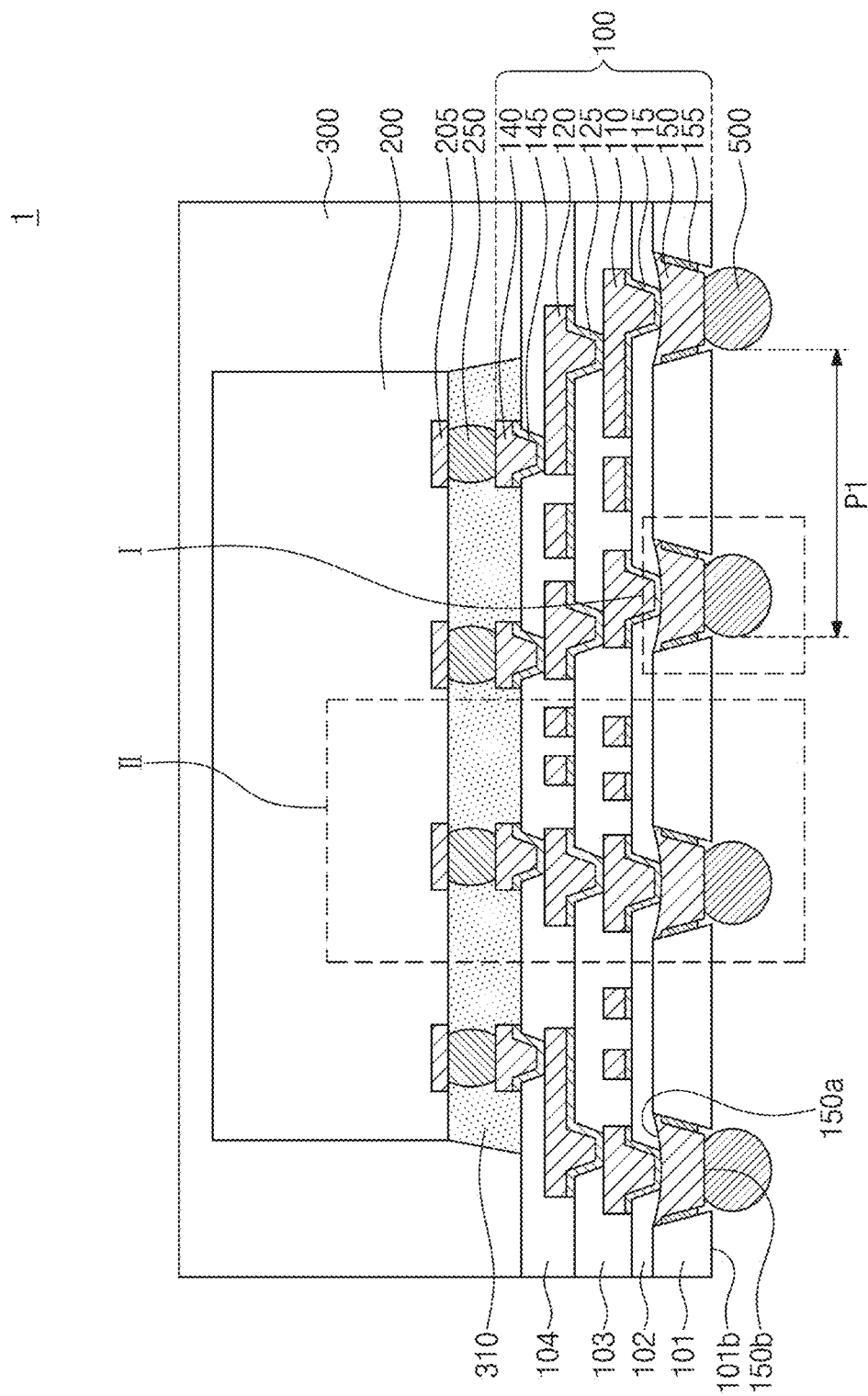
FIG. 1A illustrates a cross-sectional view showing a semiconductor package according to some example embodiments.

In this description, like reference numerals may indicate like components. The following will now describe semiconductor packages and their fabricating methods according to the present inventive concepts.

When the words "about" and "substantially" are used in this application in connection with a numerical value, it is intended that the associated numerical value include a tolerance of ±10% around the stated numerical value, unless otherwise explicitly defined. Further, regardless of whether numerical values are modified as "about" or "substantially," it will be understood that these values should be construed as including a of ±10% around the stated numerical value.

Figure 1B:
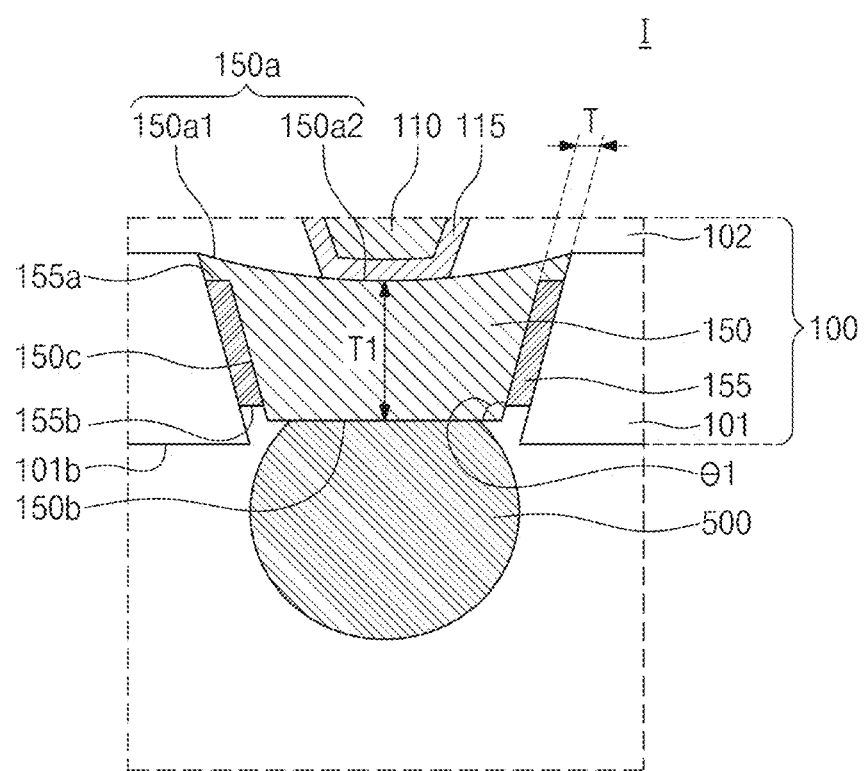
FIG. 1B illustrates an enlarged view showing section I of FIG. 1A.
Figure 1C:
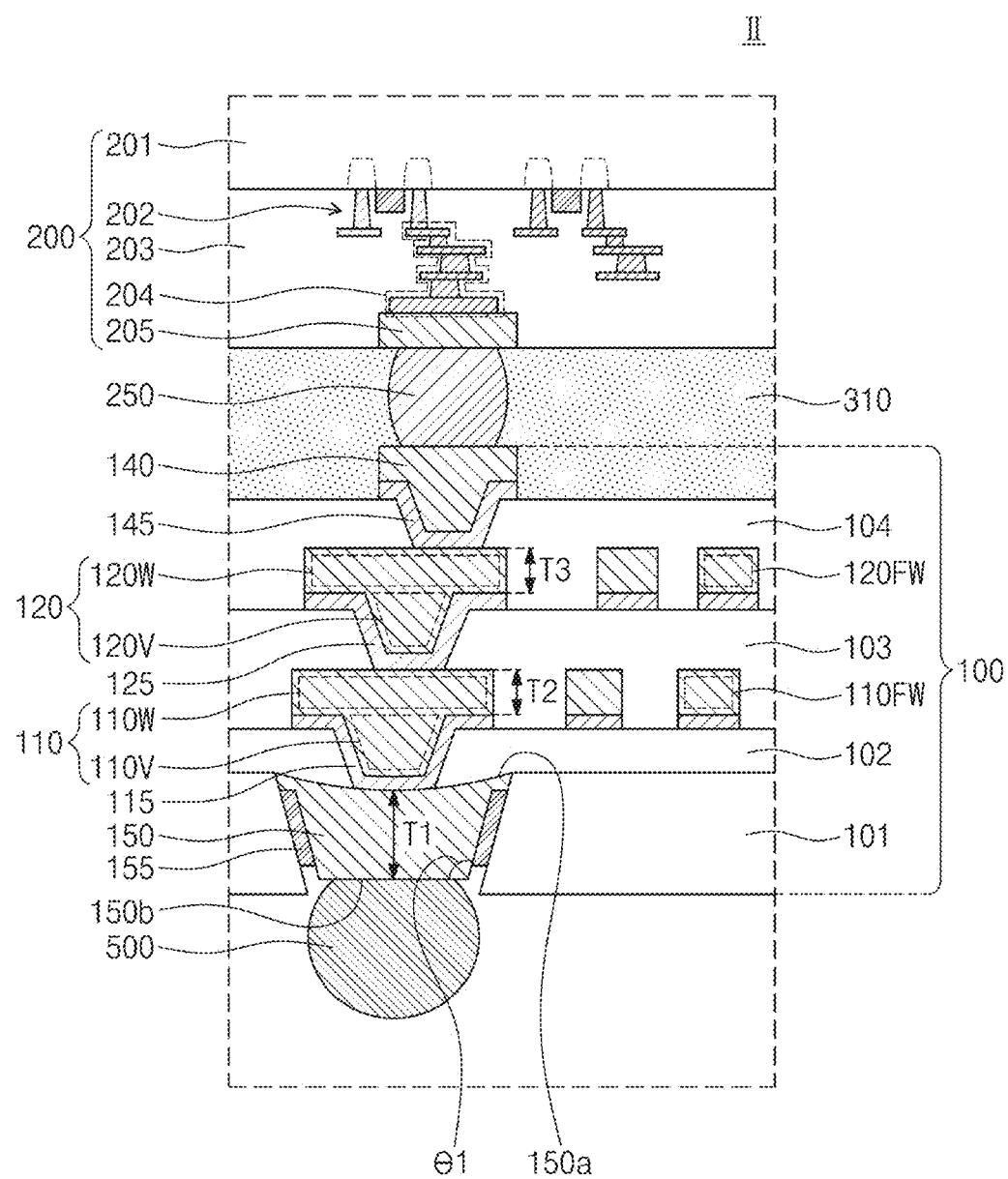
FIG. 1C illustrates an enlarged view showing section II of FIG. 1A.

FIG. 1A illustrates a cross-sectional view showing a semiconductor package according to some example embodiments. FIG. 1B illustrates an enlarged view showing section I of FIG. 1A. FIG. 1C illustrates an enlarged view showing section II of FIG. 1A.

Referring to FIGS. 1A to 1C, a semiconductor package 1 may include solder terminals 500, a redistribution substrate 100, and/or a semiconductor chip 200. The redistribution substrate 100 may include an under-bump pattern 150, an under-bump seed pattern 155, a first redistribution pattern 110, a first seed pattern 115, a second redistribution pattern 120, a second seed pattern 125, a redistribution pad 140, a seed pad 145, and/or dielectric layers 101, 102, 103, and/or 104. The dielectric layers 101, 102, 103, and/or 104 may include a first dielectric layer 101, a second dielectric layer 102, a third dielectric layer 103, and/or a fourth dielectric layer 104 that are stacked.

The under-bump pattern 150 may be provided in the first dielectric layer 101. The under-bump pattern 150 may be provided in plural, and the plurality of under-bump patterns 150 may be laterally spaced apart from each other. The phrase "two components are laterally spaced apart from each other" may mean "two components are horizontally spaced apart from each other." The term "horizontal" may indicate "parallel to a bottom surface 101b of the first dielectric layer 101. The under-bump patterns 150 may serve as pads for the solder terminals 500. The under-bump patterns 150 may include a metallic material, such as copper. The following will describe a single under-bump pattern 150 with reference to FIG. 1B.

As shown in FIG. 1B, the under-bump pattern 150 may have a bottom surface 150b, a top surface 150a, and/or a sidewall 150c. The bottom surface 150b of the under-bump pattern 150 may not be covered with the first dielectric layer 101. The sidewall 150c of the under-bump pattern 150 may be an inclined sidewall. For example, the sidewall 150c of the under-bump pattern 150 may be inclined relative to the bottom surface 150b. An obtuse angle, or first angle θ1, may be created between the bottom surface 150b and the sidewall 150c of the under-bump pattern 150. For example, the first angle θ1 may range from 110° to 140°. The under-bump pattern 150 may have a width at its upper portion greater than a width at its lower portion.

The top surface 150a of the under-bump pattern 150 may be convex downwardly. For example, when viewed in plan, the under-bump pattern 150 may have a central region and an edge region. When viewed in plan, the edge region of the under-bump pattern 150 may be provided between the first dielectric layer 101 and the central region of the under-bump pattern 150. When viewed in plan, the edge region of the under-bump pattern 150 may surround the central region of the under-bump pattern 150. The top surface 150a of the under-bump pattern 150 may have a first top surface 150a1 and a second top surface 150a2. The first top surface 150a1 of the under-bump pattern 150 may correspond to a top surface at the edge region of the under-bump pattern 150. The second top surface 150a2 of the under-bump pattern 150 may correspond to a top surface at the central region of the under-bump pattern 150. The first top surface 150a1 of the under-bump pattern 150 may be located at a higher level than that of the second top surface 150a2 of the under-bump pattern 150.

The under-bump pattern 150 may have a relatively large thickness T1. The thickness T1 of the under-bump pattern 150 may be a minimum thickness and may correspond to an interval between the bottom surface 150b and the second top surface 150a2 of the under-bump pattern 150. When the thickness T1 of the under-bump pattern 150 is less than about 5 μm, the semiconductor package 1 may decrease in high-power characteristics. According to some example embodiments, the thickness T1 of the under-bump pattern 150 may range from about 5 μm to about 10 μm. The semiconductor package 1 may have excellent high-power characteristics. As the thickness T1 of the under-bump pattern 150 is less than about 10 μm, the redistribution substrate 100 may be easy to fabricate. In addition, the semiconductor package 1 may become small in size.

The first dielectric layer 101 may be provided on the sidewall 150c of the under-bump pattern 150. The first dielectric layer 101 may be a lowermost dielectric layer. As shown in FIG. 1B, the bottom surface 150b of the under-bump pattern 150 may be located at a higher level than that of a bottom surface 101b of the first dielectric layer 101. In this description, the term "level" may mean a vertical level, and a difference in level may be measured in a direction perpendicular to the bottom surface 101b of the first dielectric layer 101. The first dielectric layer 101 may include an organic material, such as a photosensitive polymer. In this description, the photosensitive polymer may include, for example, at least one selected from photosensitive polyimide, polybenzoxazole, phenolic polymers, and/or benzocyclobutene polymers.

The under-bump seed pattern 155 may be interposed between the first dielectric layer 101 and the sidewall 150c of the under-bump pattern 150. The under-bump seed pattern 155 may be directly in physical contact with the sidewall 150c of the under-bump pattern 150. The under-bump seed pattern 155 may have a top surface 155a and a bottom surface 155b that are opposite to each other. The under-bump pattern 150 may extend onto and cover a top surface 155a of the under-bump seed pattern 155. The first top surface 150a1 of the under-bump pattern 150 may be located at a higher level than that of the top surface 155*a* of the under-bump seed pattern 155. When viewed in plan, the first top surface 150*a*1 of the under-bump pattern 150 may overlap the top surface 155*a* of the under-bump seed pattern 155.

The under-bump seed pattern 155 may have a bottom surface 155*b* disposed between the first dielectric layer 101 and the under-bump pattern 150. The bottom surface 155*b* of the under-bump seed pattern 155 may be located at a higher level than that of the bottom surface 101*b* of the first dielectric layer 101. The bottom surface 155*b* of the under-bump seed pattern 155 may be located at a level the same as or higher than that of the bottom surface 150*b* of the under-bump pattern 150. A difference in level between the bottom surface 101*b* of the first dielectric layer 101 and the bottom surface 150*b* of the under-bump pattern 150 may be about 80% to about 120% of a thickness T of the under-bump seed pattern 155. For example, a range of about 0.05 μm to about 0.1 μm may be given as the difference in level between the bottom surface 101*b* of the first dielectric layer 101 and the bottom surface 150*b* of the under-bump pattern 150.

The under-bump seed pattern 155 may cover the sidewall 150*c* of the under-bump pattern 150, and may thus reduce or prevent the under-bump pattern 150 from being damaged due to external impurities or due to impurities of the first dielectric layer 101. The impurities may be chloride ions. For example, even when the semiconductor package 1 operates repeatedly, it may be possible to reduce or prevent the under-bump pattern 150 from being corroded or spaced apart from the first dielectric layer 101. Accordingly, the semiconductor package 1 may increase in reliability and durability.

The second dielectric layer 102 may be disposed on the first dielectric layer 101 and the top surface 150*a* of the under-bump pattern 150. The second dielectric layer 102 may cover the top surface 150*a* of the under-bump pattern 150. The second dielectric layer 102 may include, for example, a photosensitive polymer. For example, the second dielectric layer 102 may include the same photosensitive material as that of the first dielectric layer 101. The first dielectric layer 101 and the second dielectric layer 102 may have an indistinct boundary therebetween, but the present inventive concepts are not limited thereto.

Referring to FIGS. 1A and 1C, the first redistribution pattern 110 may be provided on the under-bump pattern 150. The first redistribution pattern 110 may include metal, such as copper. As shown in FIG. 1C, the first redistribution pattern 110 may include a first via part 110V and/or a first wiring part 110W. In this description, a via part of a certain conductive component may be a portion for vertical connection. A wiring part of a certain conductive component may be a portion for horizontal connection. The first via part 110V may be disposed in the second dielectric layer 102 and coupled to the under-bump pattern 150. The first via part 110V may be disposed between the under-bump pattern 150 and the first wiring part 110W. The first via part 110V may have a shape that corresponds to that of the top surface 150*a* of the under-bump pattern 150. The first via part 110V may have a bottom surface that is convex downwardly. The first via part 110V may have a width less than that of the under-bump pattern 150.

The first wiring part 110W may be provided on the first via part 110V, and the first wiring part 110W and the first via part 110V may be connected to each other with no boundary therebetween. The first wiring part 110W may have a width greater than that of the first via part 110V. The first wiring part 110W may extend onto a top surface of the second dielectric layer 102 and may have a major axis that extends in a first direction. The first direction may be parallel to the bottom surface 101*b* of the first dielectric layer 101. The first wiring part 110W may have a thickness T2 of about 3 μm to about 5 μm.

The first redistribution pattern 110 may further include first fine-wiring parts 110FW. The first fine-wiring parts 110FW may be disposed on the top surface of the second dielectric layer 102. Although not shown, each or one or more of the first fine-wiring parts 110FW may be connected to the first via part 110V or the first wiring part 110W. The first fine-wiring parts 110FW and the first wiring part 110W may be formed in a single process. Each or one or more of the first fine-wiring parts 110FW may have a thickness substantially the same as the thickness T2 of the first wiring part 110W.

The first seed pattern 115 may be disposed on a bottom surface of the first redistribution pattern 110. For example, the first seed pattern 115 may be interposed between the under-bump pattern 150 and the first via part 110V, and may cover a sidewall of the first via part 110V and a bottom surface of the first wiring part 110W. The first seed pattern 115 may not extend onto a sidewall of the first wiring part 110W. The first seed pattern 115 may be provided on bottom surfaces of the first fine-wiring parts 110FW. The first seed pattern 115 may include a material different from that of the under-bump pattern 150 and that of the first redistribution pattern 110. For example, the first seed pattern 115 may include a conductive seed material. The conductive seed material may include one or more of copper, titanium, and/or any alloy thereof. The first seed pattern 115 may serve as a barrier layer to reduce or prevent diffusion of materials included in the first redistribution pattern 110.

The third dielectric layer 103 may be disposed on the second dielectric layer 102 and may cover the first redistribution pattern 110. The third dielectric layer 103 may include, for example, a photosensitive polymer. The third dielectric layer 103 may include the same material as that of the second dielectric layer 102. The second dielectric layer 102 and the third dielectric layer 103 may have an indistinct boundary therebetween, but the present inventive concepts are not limited thereto.

The second redistribution pattern 120 may be disposed on and electrically connected to the first redistribution pattern 110. The second redistribution pattern 120 may include metal, such as copper. The second redistribution pattern 120 may include a second wiring part 120W and/or a second via part 120V. The second via part 120V may be provided in the third dielectric layer 103 and coupled to the first redistribution pattern 110. The second wiring part 120W may be provided on the second via part 120V, and the second wiring part 120W and the second via part 120V may be connected to each other with no boundary therebetween. The second via part 120V may be interposed between the first redistribution pattern 110 and the second wiring part 120W. The second wiring part 120W may extend onto a top surface of the third dielectric layer 103. The second wiring part 120W may have a thickness T3 of about 3 μm to about 5 μm.

The second redistribution pattern 120 may further include second fine-wiring parts 120FW. The second fine-wiring parts 120FW may be disposed on the top surface of the third dielectric layer 103. Although not shown, each or one or more of the second fine-wiring parts 120FW may be connected to the second via part 120V. The second fine-wiring parts 120FW and the second wiring part 120W may be formed in a single process. Each or one or more of the second fine-wiring parts 120FW may have a thickness substantially the same as the thickness T3 of the second wiring part 120W. The thickness of each or one or more of the second fine-wiring parts 120FW may range from about 3 μm to about 5 μm.

The second seed pattern 125 may be disposed on a bottom surface of the second redistribution pattern 120. The second seed pattern 125 may be interposed between the first redistribution pattern 110 and the second redistribution pattern 120. For example, the second seed pattern 125 may cover a bottom surface and/or a sidewall of the second via part 120V and may also cover a bottom surface of the second wiring part 120W. The second seed pattern 125 may not extend onto a sidewall of the second wiring part 120W. The second seed pattern 125 may further be disposed on bottom surfaces of the second fine-wiring parts 120FW. The second seed pattern 125 may include, for example, a conductive seed material. The second seed pattern 125 may serve as a barrier layer to reduce or prevent diffusion of materials included in the second redistribution pattern 120.

The fourth dielectric layer 104 may be disposed on the third dielectric layer 103 and may cover the second redistribution pattern 120. The fourth dielectric layer 104 may include, for example, a photosensitive polymer. The fourth dielectric layer 104 may include the same material as that of the third dielectric layer 103. The third dielectric layer 103 and the fourth dielectric layer 104 may have an indistinct boundary therebetween, but the present inventive concepts are not limited thereto.

The redistribution pad 140 may be disposed on and coupled to the second redistribution pattern 120. As the first and second redistribution patterns 110 and 120 are provided, the redistribution pad 140 may not be vertically aligned with the under-bump pattern 150 electrically connected thereto. Therefore, it may be possible to freely design an arrangement of the under-bump pattern 150 and/or the redistribution pad 140. The redistribution pad 140 may have a lower portion disposed in the fourth dielectric layer 104. The redistribution pad 140 may have an upper portion disposed on a top surface of the fourth dielectric layer 104. The upper portion of the redistribution pad 140 may have a width greater than that of the lower portion of the redistribution pad 140. The redistribution pad 140 may include metal, such as copper.

Although not shown, the redistribution pad 140 may further include a bonding part. The bonding part may be exposed on the top surface of the redistribution pad 140. The bonding part may be in direct contact with a solder bump 250 which will be discussed below. The bonding part may include one or more of nickel, gold, and any alloy thereof. The bonding part may serve as a passivation layer or an adhesive layer.

The seed pad 145 may be provided on a bottom surface of the redistribution pad 140. The seed pad 145 may be interposed between the second redistribution pattern 120 and the redistribution pad 140, and may extend between the fourth dielectric layer 104 and the redistribution pad 140. The seed pad 145 may include a different material from that of the redistribution pad 140. The seed pad 145 may include, for example, a conductive seed material.

The first redistribution pattern 110 may be provided in plural. The plurality of first redistribution patterns 110 may be laterally spaced apart from each other and electrically separated from each other. The second redistribution pattern 120 may be provided in plural. The plurality of second redistribution patterns 120 may be electrically connected to corresponding first redistribution patterns 110. The second redistribution patterns 120 may be laterally spaced apart from each other and electrically separated from each other. The redistribution pad 140 may be provided in plural. The plurality of redistribution pads 140 may be coupled to corresponding second redistribution patterns 120. The redistribution pads 140 may be laterally spaced apart from each other and electrically separated from each other.

When the first dielectric layer 101 extends onto the top surface 150a of the under-bump pattern 150, the first dielectric layer 101 may have an undulation on a top surface thereof. In this case, the plurality of first redistribution patterns 110 may have undulations on top surfaces thereof. For example, the top surface of the first redistribution patterns 110 may be located at different levels from each other. For example, a value equal to or higher than about 2 μm may be given as a difference in level between uppermost and lowermost portions of the top surfaces of the first redistribution patterns 110. In addition, the plurality of second redistribution patterns 120 may have undulations on top surfaces thereof. The top surfaces of the second redistribution patterns 120 may be located at significantly different levels from each other. An increase in thickness T1 of the under-bump pattern 150 may increase in undulation on the top surfaces of the first and second redistribution patterns 110 and 120. The undulations on the top surfaces of the first and second redistribution patterns 110 and 120 may induce failure of electrical connection between the first redistribution patterns 110 and the second redistribution patterns 120 or between the second redistribution patterns 120 and the redistribution pads 140.

According to some example embodiments, the first dielectric layer 101 may not extend onto the top surface 150a of the under-bump pattern 150. The first dielectric layer 101 may have an uppermost surface located at a level the same as or similar to that of the top surface 150a of the under-bump pattern 150. Therefore, it may be possible to reduce or prevent the occurrence of undulations on the top surfaces of the first and second redistribution patterns 110 and 120. For example, a value equal to or less than about 2 μm may be given as a difference in level between uppermost and lowermost portions of the top surfaces of the first redistribution patterns 110. In this description, the top surfaces of the first redistribution patterns 110 may include top surfaces of the first wiring parts 110W and top surfaces of the first fine-wiring parts 110FW. A value equal to or less than about 2 μm may be given as a difference in level between uppermost and lowermost portions of the top surfaces of the second redistribution patterns 120. The top surfaces of the second redistribution patterns 120 may include top surfaces of the second wiring parts 120W and/or top surfaces of the second fine-wiring parts 120FW. The phrase "a value equal to or less than about 2 μm is or may be given as a difference in level between two parts" may include "no level difference between the two parts." For example, the phrase "a value equal to or less than about 2 μm is or may be given as a difference in level between two parts" may include a case where the two parts are located at substantially the same level. Therefore, good electrical connection may be provided between the first redistribution patterns 110 and the second redistribution patterns 120 and between the second redistribution patterns 120 and the redistribution pads 140. Accordingly, the semiconductor package 1 may increase in reliability.

The thickness T1 of the under-bump pattern 150 may be relatively large. For example, the thickness T1 of the under-bump pattern 150 may be greater than the thickness T2 of the first wiring part 110W and/or the thickness T3 of the second wiring part 120W. Even when the thickness T1 of the under-bump pattern 150 is relatively large, the first dielectric layer 101 may not extend onto the top surface 150a of the under-bump pattern 150 and thus undulations on the top surfaces of the first and/or second redistribution patterns 110 and 120 may be reduced or prevented.

The stack number of the redistribution patterns 110 and 120 may be variously changed. For example, the redistribution substrate 100 may further include a third redistribution pattern. In this case, the third redistribution pattern may be interposed between the second redistribution pattern 120 and the redistribution pad 140.

The semiconductor chip 200 may be mounted on a top surface of the redistribution substrate 100. As shown in FIG. 1C, the semiconductor chip 200 may include a semiconductor substrate 201, integrated circuits 202, a wiring layer, and chip pads 205. The integrated circuits 202 may be disposed on a bottom surface of the semiconductor substrate 201. The integrated circuits 202 may include logic circuits, memory circuits, and/or any combination thereof. The wiring layer may be disposed on the bottom surface of the semiconductor substrate 201. The wiring layer may include a dielectric pattern 203 and/or wiring structures 204. The wiring structures 204 may be disposed in the dielectric pattern 203. The chip pads 205 may be disposed on a bottom surface of the wiring layer. For example, the chip pads 205 may be exposed on a bottom surface of the semiconductor chip 200. The chip pads 205 may be coupled through the wiring structures 204 to the integrated circuits 202. The phrase "a certain component is electrically connected to a semiconductor chip" may mean "the certain component is electrically connected through chip pads of the semiconductor chip to integrated circuits of the semiconductor chip."

Referring to FIG. 1A, solder bumps 250 may be provided between the redistribution substrate 100 and the semiconductor chip 200, and may electrically connect the redistribution pads 140 to corresponding chip pads 205. Therefore, the semiconductor chip 200 may be coupled through the solder bumps 250 to the redistribution substrate 100. The phrase "coupled to the redistribution substrate 100" may indicate "coupled to one or more of the first and second redistribution patterns 110 and 120." Each or one or more of the solder bumps 250 may have a solder-ball shape and may include a solder material. In this description, the solder material may include tin, bismuth, lead, silver, or any alloy thereof. Although not shown, each or one or more of the solder bumps 250 may further include a pillar.

The semiconductor package 1 may further include a molding layer 300. The molding layer 300 may be disposed on the redistribution substrate 100 and may cover the semiconductor chip 200. The molding layer 300 may cover an uppermost one of the first, second, third, and/or fourth dielectric layer 101, 102, 103, and 104. The uppermost dielectric layer may be the fourth dielectric layer 104. The molding layer 300 may include a dielectric polymer, such as an epoxy-based molding compound.

The semiconductor package 1 may further include an under-fill layer 310. The under-fill layer 310 may extend into a gap between the redistribution substrate 100 and the semiconductor chip 200, thereby encapsulating the solder bumps 250. The under-fill layer 310 may include a dielectric polymer, such as an epoxy-based molding compound. However, the under-fill layer 310 may include a different material from that of the molding layer 300. In some example embodiments, the under-fill layer 310 may be omitted, and the molding layer 300 may extend into a gap between the redistribution substrate 100 and the semiconductor chip 200.

The solder terminals 500 may be disposed on a bottom surface of the redistribution substrate 100. For example, the solder terminals 500 may be disposed on corresponding bottom surfaces 150b of the under-bump patterns 150 and electrically connected to corresponding under-bump patterns 150. The solder terminals 500 may be in direct contact with the corresponding bottom surface 150b of the under-bump patterns 150. Therefore, the solder terminals 500 may be electrically connected through the redistribution substrate 100 to the semiconductor chip 200. Each or one or more of the solder terminals 500 may have a solder-ball shape and may include a solder material. The solder terminals 500 may have a pitch P1 greater than that of the solder bumps 250.

Although not shown, a thermal radiation structure may further be disposed on a top surface of the semiconductor chip 200 and a top surface of the molding layer 300. In this case, the molding layer 300 may expose the top surface of the semiconductor chip 200. The thermal radiation structure may include a heat sink, a heat slug, or a thermal interface material (TIM) layer.

Figure 1D:
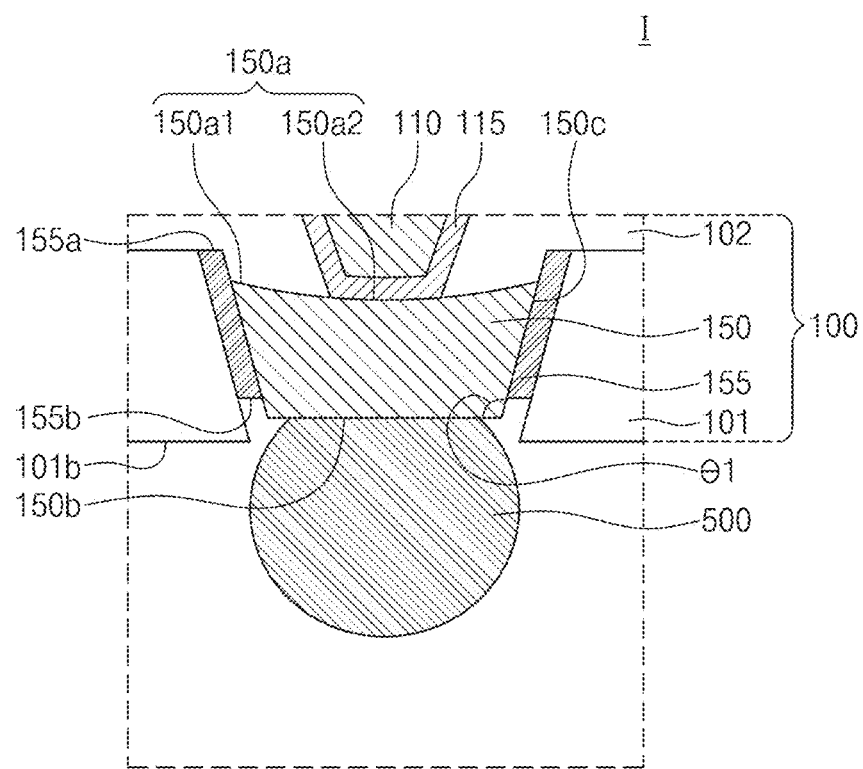
FIG. 1D illustrates a cross-sectional view showing an under-bump pattern and an under-bump seed pattern according to some example embodiments.

FIG. 1D illustrates an enlarged view of section I depicted in FIG. 1A, showing an under-bump pattern and an under-bump seed pattern according to some example embodiments. A duplicate description will be omitted below.

Referring to FIG. 1D, the under-bump seed pattern 155 may be interposed between the first dielectric layer 101 and the sidewall 150c of the under-bump pattern 150. The under-bump seed pattern 155 and the under-bump pattern 150 may be substantially the same as those discussed with reference to FIGS. 1A to 1C. For example, the top surface 150a of the under-bump pattern 150 may include the first top surface 150a1 at the edge region of the under-bump pattern 150, and may also include the second top surface 150a2 at the central region of the under-bump pattern 150. The second top surface 150a2 of the under-bump pattern 150 may be located at a lower level than that of the first top surface 150a1 of the under-bump pattern 150.

The under-bump pattern 150 may not extend onto the top surface 155a of the under-bump seed pattern 155. The first top surface 150a1 of the under-bump pattern 150 may be located at a lower level than that of the top surface 155a of the under-bump seed pattern 155. An uppermost surface of the under-bump pattern 150 may be located at a lower level than that of the top surface 155a of the under-bump seed pattern 155.

The second dielectric layer 102 may cover the top surface 155a of the under-bump seed pattern 155 and the top surface 150a of the under-bump pattern 150. The second dielectric layer 102 may also cover an upper inner sidewall of the under-bump seed pattern 155. The top surface 155a of the under-bump seed pattern 155 may be directly in physical contact with the second dielectric layer 102.

Figure 1E:
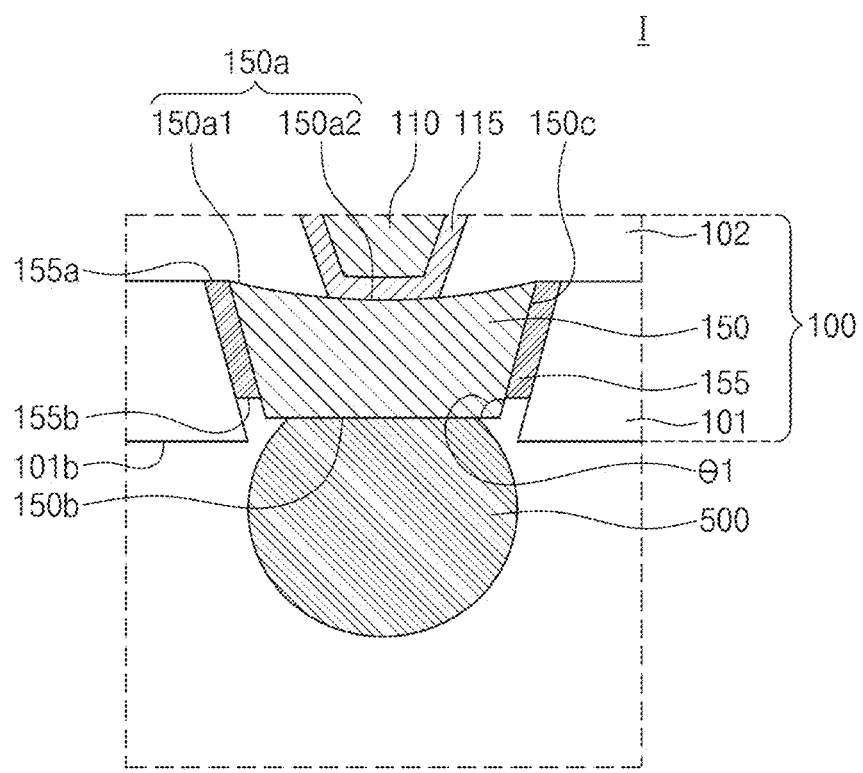
FIG. 1E illustrates a cross-sectional view showing an under-bump pattern and an under-bump seed pattern according to some example embodiments.

FIG. 1E illustrates an enlarged view of section I depicted in FIG. 1A, showing an under-bump pattern and an under-bump seed pattern according to some example embodiments. A duplicate description will be omitted below.

Referring to FIG. 1E, the under-bump seed pattern 155 may be interposed between the first dielectric layer 101 and the sidewall 150c of the under-bump pattern 150. The under-bump seed pattern 155 and the under-bump pattern 150 may be substantially the same as those discussed with reference to FIGS. 1A to 1C. However, the top surface 155a of the under-bump seed pattern 155 may be located at substantially the same level as that of an uppermost surface of the under-bump pattern 150. For example, the top surface 155a of the under-bump seed pattern 150 may be located at substantially the same level as that of at least a portion of the first top surface 150a1 of the under-bump pattern 150.

FIGS. 2A, 2B, 2D to 2I, and 2K to 2R illustrate cross-sectional views showing a method of fabricating a semiconductor package according to some example embodiments. FIG. 2C illustrates an enlarged view showing section III of FIG. 2B. FIG. 2J illustrates an enlarged view showing section III of FIG. 2I. A duplicate description will be omitted below.

Figure 2A:
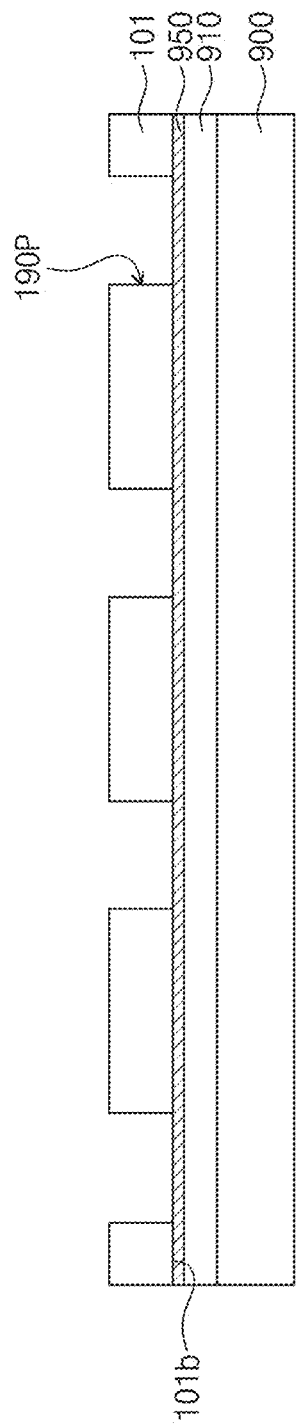

Referring to FIG. 2A, a glue layer 910, an etch stop layer 950, and/or a first dielectric layer 101 may be formed on a carrier substrate 900. According to some example embodiments, a photosensitive polymer may be coated on the carrier substrate 900, thereby forming the glue layer 910. A deposition process may form the etch stop layer 950 on the glue layer 910. The deposition process may include a sputtering process. The etch stop layer 950 may be attached through the glue layer 910 to the carrier substrate 900. Differently from that shown, either the glue layer 910 or the etch stop layer 950 may not be formed.

The first dielectric layer 101 may be formed on the etch stop layer 950. The first dielectric layer 101 may be formed by a coating process such as spin coating and/or slit coating. The first dielectric layer 101 may be patterned to form a preliminary opening 190P in the first dielectric layer 101. The patterning of the first dielectric layer 101 may be performed by exposure and/or development processes. The preliminary opening 190P may expose the etch stop layer 950. The preliminary opening 190P may be substantially perpendicular to a bottom surface 101b of the first dielectric layer 101.

Figure 2B:
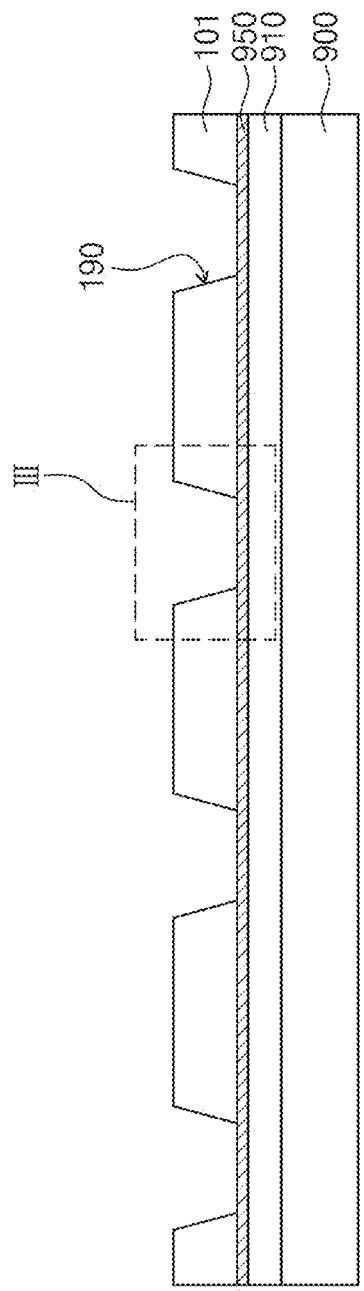
Figure 2C:
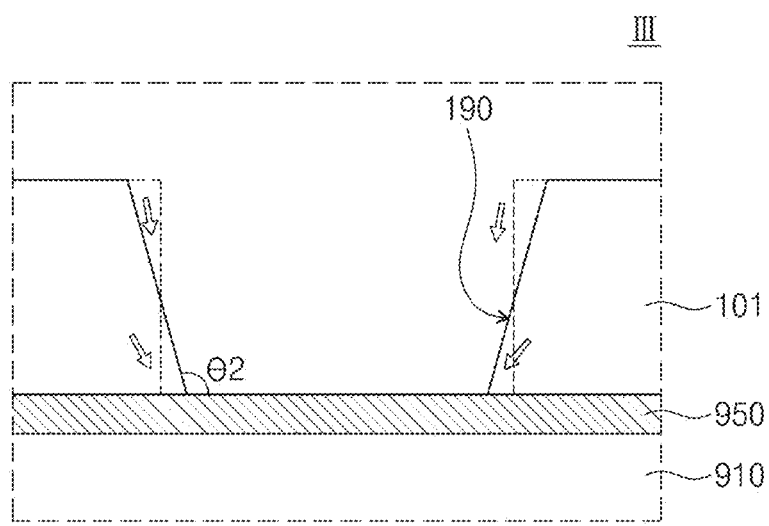
FIG. 2C illustrates an enlarged view showing section III of FIG. 2B.

Referring to FIGS. 2B and 2C, the first dielectric layer 101 may be cured to form an opening 190. A thermal curing process may be performed to cure the first dielectric layer 101. While the first dielectric layer 101 is cured, the first dielectric layer 101 may undergo shrinkage such that a portion of the first dielectric layer 101 may flow as indicated by arrows depicted in FIG. 2C. Therefore, the preliminary opening 190P may be formed into the opening 190.

A sidewall of the opening 190 may be inclined relative to a bottom surface of the opening 190. An obtuse angle, or second angle θ2, may be created between the sidewall and the bottom surface of the opening 190. For example, the second angle θ2 may range from about 110° to about 140°. The sidewall of the opening 190 may correspond to an inner sidewall of the first dielectric layer 101. The bottom surface of the opening 190 may be an exposed top surface of the etch stop layer 950. The opening 190 may have a width at an upper portion thereof greater than a width at a lower portion thereof.

Figure 2D:
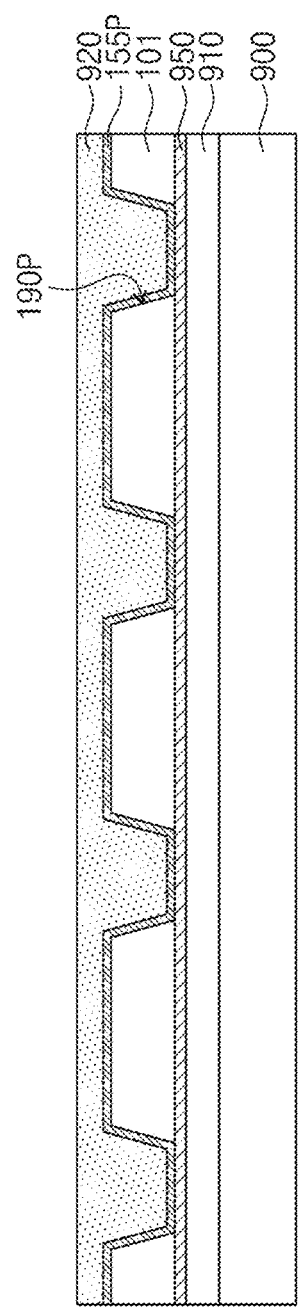

Referring to FIG. 2D, an under-bump seed layer 155P may be formed in the opening 190 and/or a top surface of the first dielectric layer 101. The under-bump seed layer 155P may conformally cover the bottom surface and/or the sidewall of the opening 190 and/or the top surface of the first dielectric layer 101. The under-bump seed layer 155P may include a first part in the opening 190 and/or a second part on the top surface of the first dielectric layer 101. A deposition process may be performed to form the under-bump seed layer 155P. The deposition process may include a sputtering process. The under-bump seed layer 155P may include a conductive seed material. The under-bump seed layer 155P may include the same material as that of the etch stop layer 950, but the present inventive concepts are not limited thereto.

A resist layer 920 may be formed on and cover the under-bump seed layer 155P. The resist layer 920 may fill the opening 190 and may extend onto the top surface of the first dielectric layer 101. The resist layer 920 may be performed by a coating process such as spin coating and/or slit coating. The resist layer 920 may include a polymer and/or a resin. The resist layer 920 may include a photoresist material.

Figure 2E:
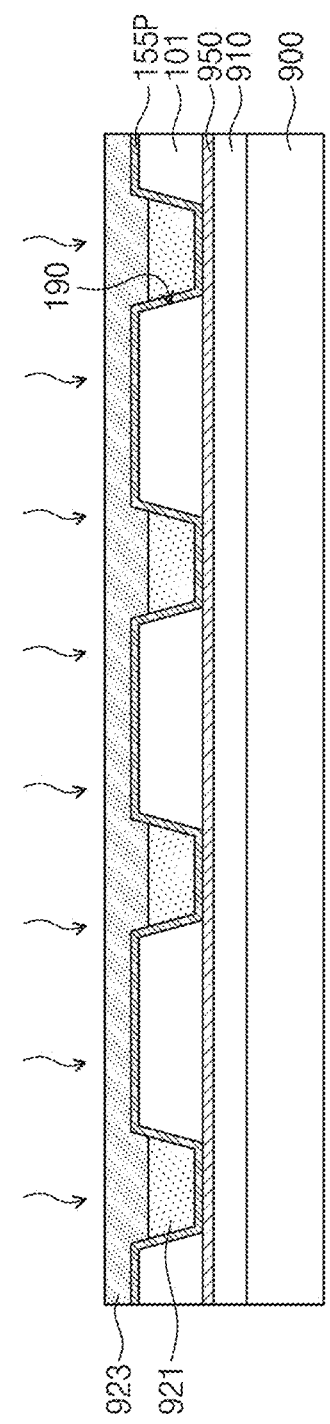

Referring to FIG. 2E, the resist layer 920 may undergo an exposure process to form a first resist pattern 921 and/or a second resist pattern 923. No photomask may be separately used in the exposure process. However, an exposure dose may be adjusted in the exposure process.

The resist layer 920 may have at its upper portion a chemical structure that is changed due to light, and as a result the second resist pattern 923 may be formed. For example, the second resist pattern 923 may be provided on the top surface of the first dielectric layer 101 and may cover the first part of the under-bump seed layer 155P. The second resist pattern 923 may be an exposed portion of the resist layer 920.

The first resist pattern 921 may be a non-exposed portion of the resist layer 920. The first resist pattern 921 may be a lower portion of the resist layer 920. In the exposure process, an exposure dose may be adjusted such that no light may reach the lower portion of the resist layer 920. Therefore, the resist layer 920 may maintain a chemical structure at the lower portion thereof, and accordingly the first resist pattern 921 may be formed. After the termination of the exposure process, the second resist pattern 923 may have a different chemical structure from that of the first resist pattern 921.

The exposure process may continue until the first resist pattern 921 is localized in the opening 190. For example, the first resist pattern 921 may be provided in the opening 190 and may not extend onto the top surface of the first dielectric layer 101. The second resist pattern 923 may cover the under-bump seed layer 155P on the top surface of the first dielectric layer 101.

Referring to FIG. 2F, a development process may be performed on the second resist pattern 923. The second resist pattern 923 of the resist layer 920 may have a changed chemical structure, and may thus be easily removed with a developer. The removal of the second resist pattern 923 may expose the first resist pattern 921 and/or the under-bump seed layer 155P on the top surface of the first dielectric layer 101.

The first resist pattern 921 may have low or no reactivity with respect to the developer. Accordingly, the first resist pattern 921 may remain after the termination of the development process.

Differently from the description of FIGS. 2E and 2F, the patterning of the resist layer (see 920 of FIG. 2D) and the formation of the first resist pattern 921 may be achieved neither by the exposure process nor by the development process. The resist layer 920 may be patterned by an etching process such dry etching. For example, the etching process may continue until an upper portion of the resist layer 920 is removed to expose the under-bump seed layer 155P on the top surface of the first dielectric layer 101. A lower portion of the resist layer 920 may remain in the opening 190, and accordingly the first resist pattern 921 may be formed.

Referring to FIG. 2G, an exposed first portion of the under-bump seed layer 155P may be removed by an etching process to form an under-bump seed pattern 155. A wet etching process may be adopted as the etching process. The etching process may continue until the top surface of the first dielectric layer 101 is exposed. In the etching process, the first resist pattern 921 of the resist layer 920 may have an etch selectivity and may thus not be removed. As the second part of the under-bump seed layer 155P is covered with the first resist pattern 921, the second part of the under-bump seed layer 155P may not be exposed to the etching process. The second part of the under-bump seed layer 155P may be formed into the upper-bump seed pattern 155 after the termination of the etching process. The under-bump seed pattern 155 may be localized in the opening 190 and may not extend onto the top surface of the first dielectric layer 101.

Figure 2H:
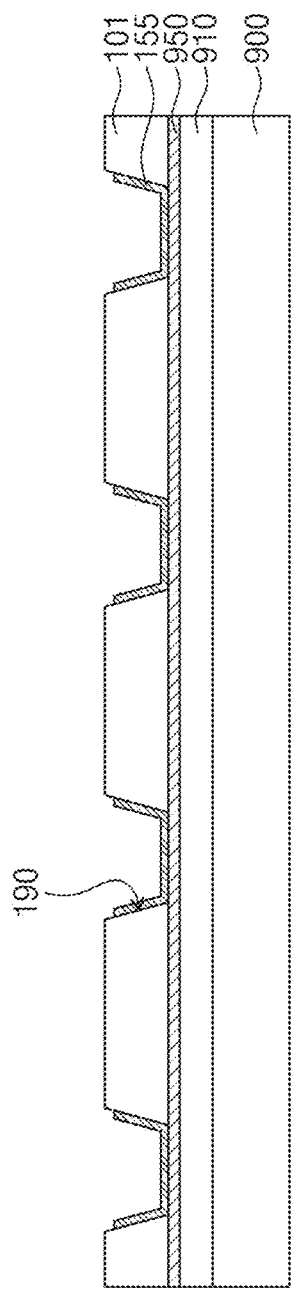

Referring to FIG. 2H, the first resist pattern 921 may be removed to expose the under-bump seed pattern 155. A strip process may be performed to remove the first resist pattern 921 of the resist layer 920.

Figure 2I:
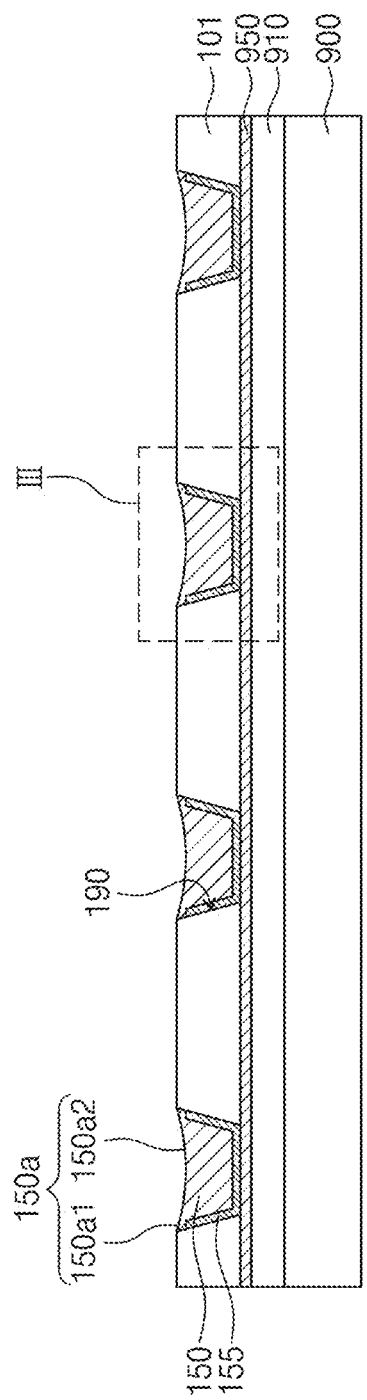
Figure 2J:
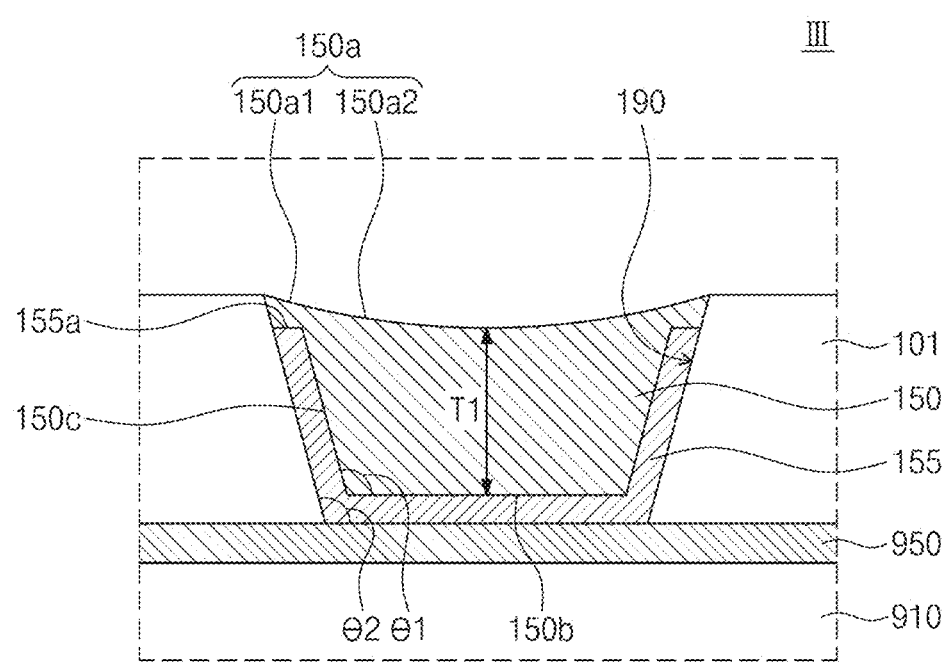
FIG. 2J illustrates an enlarged view showing section III of FIG. 2I.

Referring to FIGS. 2I and 2J, an under-bump pattern 150 may be formed in the opening 190. The under-bump pattern 150 may be formed by performing an electroplating process in which the under-bump seed pattern 155 is used as an electrode. The first dielectric layer 101 may cause that the under-bump pattern 150 is formed in the opening 190. The electroplating process may be terminated before the under-bump pattern 150 extends onto the top surface of the first dielectric layer 101. Therefore, no planarization process may be separately required or performed in forming the under-bump pattern 150. The under-bump pattern 150 may thus be manufactured in a simplified process.

When the under-bump pattern 150 is formed in an opening that is defined by a resist pattern (not shown), an angle of about 90° may be given as a first angle θ1 between a bottom surface 150b and a sidewall 150c of the under-bump pattern 150. According to some example embodiments, because the under-bump pattern 150 is formed in the opening 190 that is defined by the first dielectric layer 101, it may be possible to skip the formation and removal of the resist pattern. As a result, semiconductor package fabrication may be simplified. According to some example embodiments, the under-bump pattern 150 may have a shape that corresponds to that of the opening 190. For example, the first angle θ1 between the bottom surface 150b and/or the sidewall 150c of the under-bump pattern 150 may be substantially the same as a second angle θ2 between the bottom surface and the sidewall of the opening 190. For example, the first angle θ1 may range from about 110° to about 140°.

When the under-bump pattern 150 is formed in the opening 190 that is defined by a resist pattern, after the under-bump pattern 150 is formed and the resist pattern is removed, the first dielectric layer 101 may be formed on the etch stop layer 950. In this case, the first dielectric layer 101 may extend onto a top surface 150a of the under-bump pattern 150. Therefore, the first dielectric layer 101 may have an undulation on the top surface thereof. For example, a difference in level between uppermost and lowermost portions of the top surface of the first dielectric layer 101 may be the same as or similar to a thickness T1 of the under-bump pattern 150. According to some example embodiments, because the under-bump pattern 150 is formed in the opening 190 that is defined by the first dielectric layer 101, the top surface 150a of the under-bump pattern 150 may be located at a level the same as or similar to that of the top surface of the first dielectric layer 101. For example, a difference in level between the top surface 150a of the under-bump pattern 150 and the top surface of the first dielectric layer 101 may be less than the thickness T1 of the under-bump pattern 150.

Because the under-bump seed pattern 155 covers the sidewall and the bottom surface of the opening 190, and because the under-bump pattern 150 is formed by an electroplating process in which the under-bump seed pattern 155 is used as an electrode, the under-bump pattern 150 may have a downwardly convex shape on the top surface 150a thereof. For example, a first top surface 150a1 at an edge region of the under-bump pattern 150 may be located at a higher level than that of a second top surface 150a2 at a central region of the under-bump pattern 150.

In the electroplating process, the under-bump pattern 150 may further be formed on a top surface 155a of the under-bump seed pattern 155. Therefore, the under-bump pattern 150 may be directly in physical contact with the top surface 155a of the under-bump seed pattern 155. The first top surface 150a1 of the under-bump pattern 150 may be located at a higher level than that of the top surface 155a of the under-bump seed pattern 155.

Referring to FIG. 2K, a second dielectric layer 102 may be formed on the first dielectric layer 101, and may cover the first dielectric layer 101 and/or the under-bump pattern 150. For example, the second dielectric layer 102 may be in direct contact with the top surface 150a of the under-bump pattern 150. According to some example embodiments, because the under-bump pattern 150 is formed in the opening 190 that is defined by the first dielectric layer 101, the second dielectric layer 102 may have a reduced or no undulation on a top surface thereof. The second dielectric layer 102 may be formed by a coating process. The second dielectric layer 102 may be patterned by exposure and/or development processes to form a first hole 191. The first hole 191 may penetrate the second dielectric layer 102 and may expose the under-bump pattern 150.

A first seed layer 115P may be formed in the first hole 191 and/or on the top surface of the second dielectric layer 102. The first seed layer 115P may conformally cover the exposed under-bump pattern 150, an inner sidewall of the first hole 191, and/or the top surface of the second dielectric layer 102. The formation of the first seed layer 115P may be performed by substantially the same method used to form the under-bump seed layer 155P discussed in FIG. 2D.

Referring to FIG. 2L, an upper resist pattern 990 may be formed on the first seed layer 115P. The upper resist pattern 990 may have a guide opening 195 to expose the first seed layer 115P. A sidewall of the guide opening 195 may be substantially perpendicular to a bottom surface of the upper resist pattern 990. A first redistribution pattern 110 may be formed by performing an electroplating process in which the first seed layer 115P is used as an electrode. The first redistribution pattern 110 may be formed in the first hole 191 and may fill a lower portion of the guide opening 195.

The first redistribution pattern 110 may include a first via part 110V and a first wiring part 110W. The first via part 110V may be provided in the first hole 191. The first wiring part 110W may be formed on the first via part 110V and on the top surface of the second dielectric layer 102.

Figure 2M:
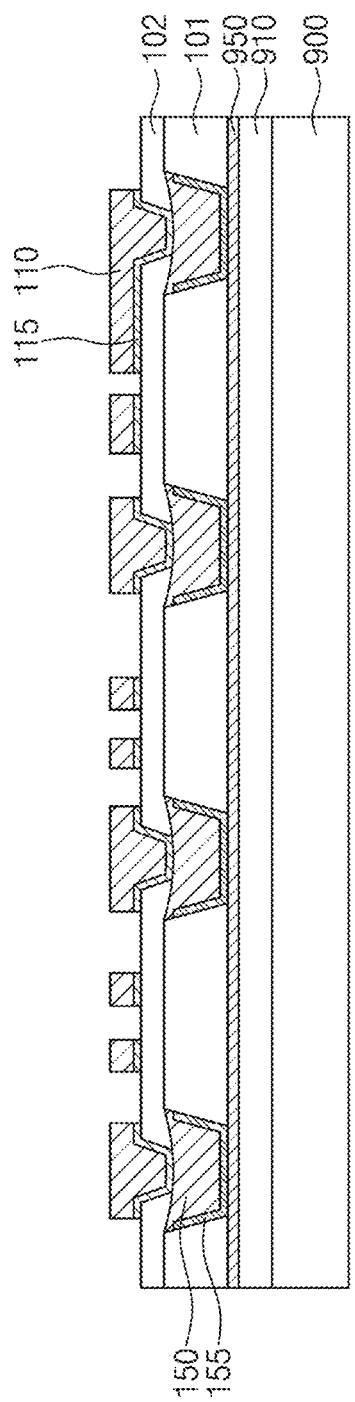

Referring to FIG. 2M, the upper resist pattern 990 may be removed to expose a top surface of a portion of the first seed layer 115P. The exposed portion of the first seed layer 115P may be etched and removed to form a first seed pattern 115. The first seed pattern 115 may be provided on a bottom surface of the first redistribution pattern 110. The first seed pattern 115 may be a portion of the first seed layer 115P that is not exposed to the etching process.

Figure 2N:
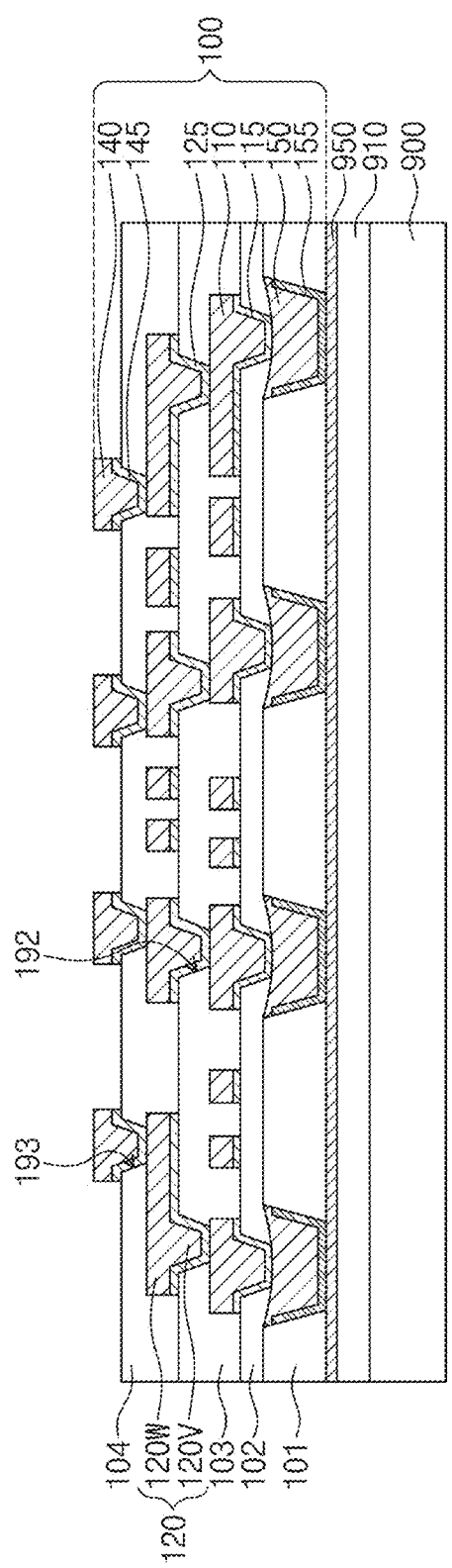
Figure 20:
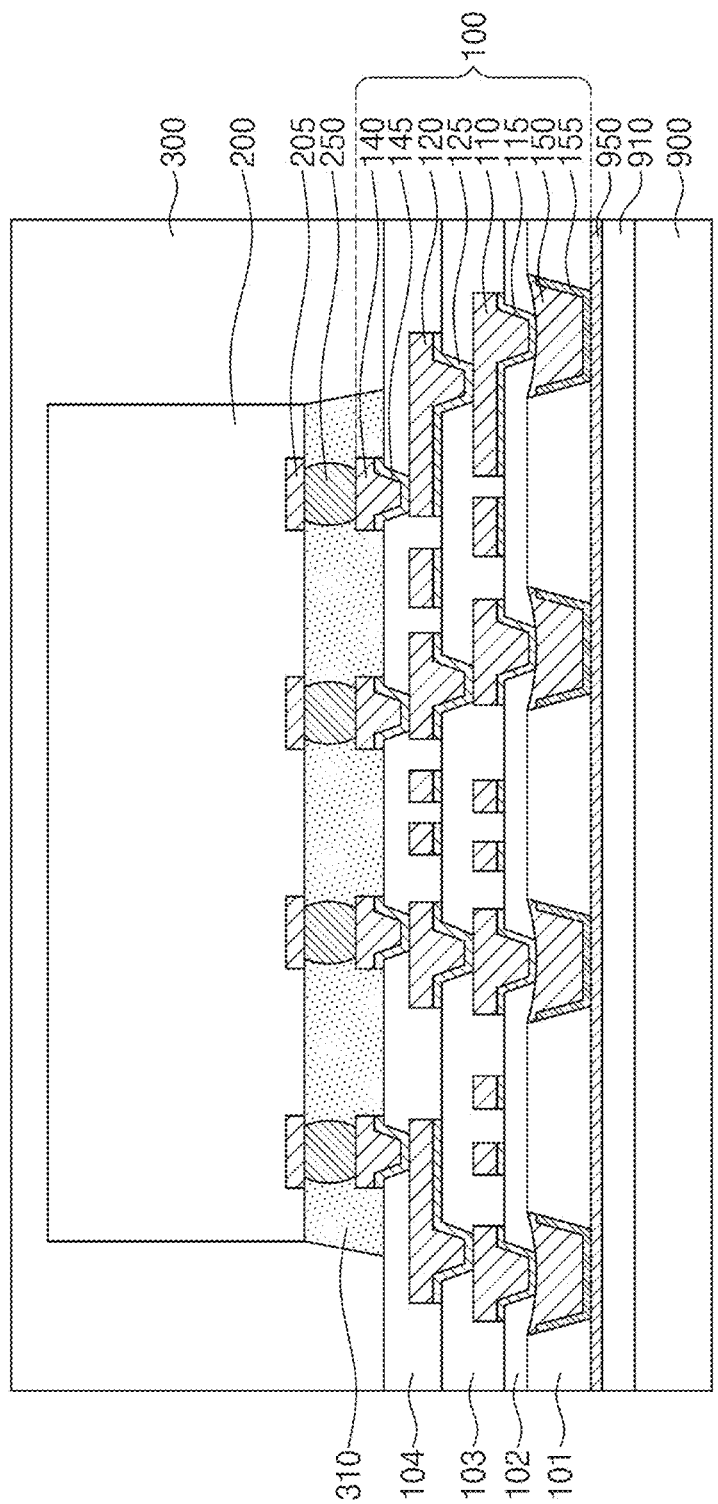

Referring to FIG. 2N, a third dielectric layer 103 and/or a second redistribution pattern 120 may be formed on the second dielectric layer 102. A second hole 192 may be formed in the third dielectric layer 103 and may expose the first redistribution pattern 110. The second redistribution pattern 120 may be formed to be coupled to the first redistribution pattern 110. The second redistribution pattern 120 may include a second via part 120V and/or a second wiring part 120W. The second via part 120V may be provided in the second hole 192. The second wiring part 120W may be formed on the second via part 120V and may extend onto a top surface of the third dielectric layer 103.

A second seed pattern 125 may be formed on a bottom surface of the second redistribution pattern 120. The formation of the second seed pattern 125 and the second redistribution pattern 120 may be performed by substantially the same method used to form the first seed pattern 115 and the first redistribution pattern 110 discussed in FIGS. 2L and 2M. For example, the second redistribution pattern 120 may be formed by performing an electroplating process in which the second seed pattern 125 is used as an electrode.

A fourth dielectric layer 104 may be formed on the third dielectric layer 103 and may cover the second redistribution pattern 120. A third hole 193 may be formed in the fourth dielectric layer 104 and may expose the second redistribution pattern 120. A redistribution pad 140 may be formed in the third hole 193 and coupled to the second redistribution pattern 120. A seed pad 145 may be formed on a bottom surface of the redistribution pad 140. According to some example embodiments, the redistribution pad 140 may be formed by performing an electroplating process in which the seed pad 145 is used as an electrode. Therefore, a redistribution substrate 100 may be manufactured. The redistribution substrate 100 may include the first, second, third, and/or fourth dielectric layers 101, 102, 103, and 104, the under-bump seed pattern 155, the under-bump pattern 150, the first and/or second seed patterns 115 and 125, the first and second redistribution patterns 110 and 120, the seed pad 145, and/or the redistribution pad 140.

Referring to FIG. 2O, a semiconductor chip 200 may be prepared which has chip pads 205. The semiconductor chip 200 may be mounted on a top surface of the redistribution substrate 100. For example, the semiconductor chip 200 may be disposed on the redistribution substrate 100 to allow the chip pads 205 to align with a plurality of redistribution pads 140. The mounting of the semiconductor chip 200 may include forming solder bumps 250 between the chip pads 205 and the redistribution pads 140.

An under-fill layer 310 may be formed in a gap between the redistribution substrate 100 and the semiconductor chip 200, thereby encapsulating the solder bumps 250. A molding layer 300 may be formed on the top surface of the redistribution substrate 100, thereby covering the semiconductor chip 200.

Figure 2P:
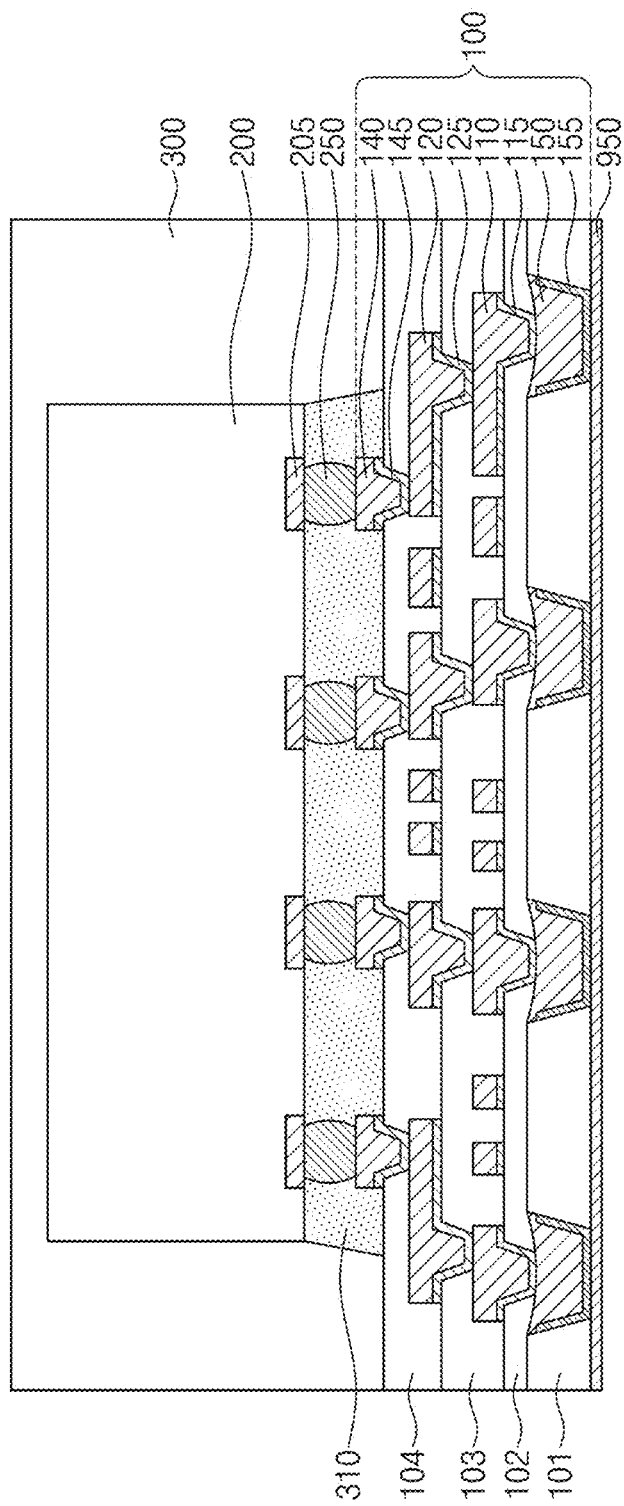

Referring to FIG. 2P, the carrier substrate 900 and/or the glue layer 910 may be removed to expose the etch stop layer 950. The removal of the glue layer 910 may be performed by an etching process such as dry etching. The presence of the etch stop layer 950 may reduce or prevent the first dielectric layer 101 from being etched in the etching process.

Figure 2Q:
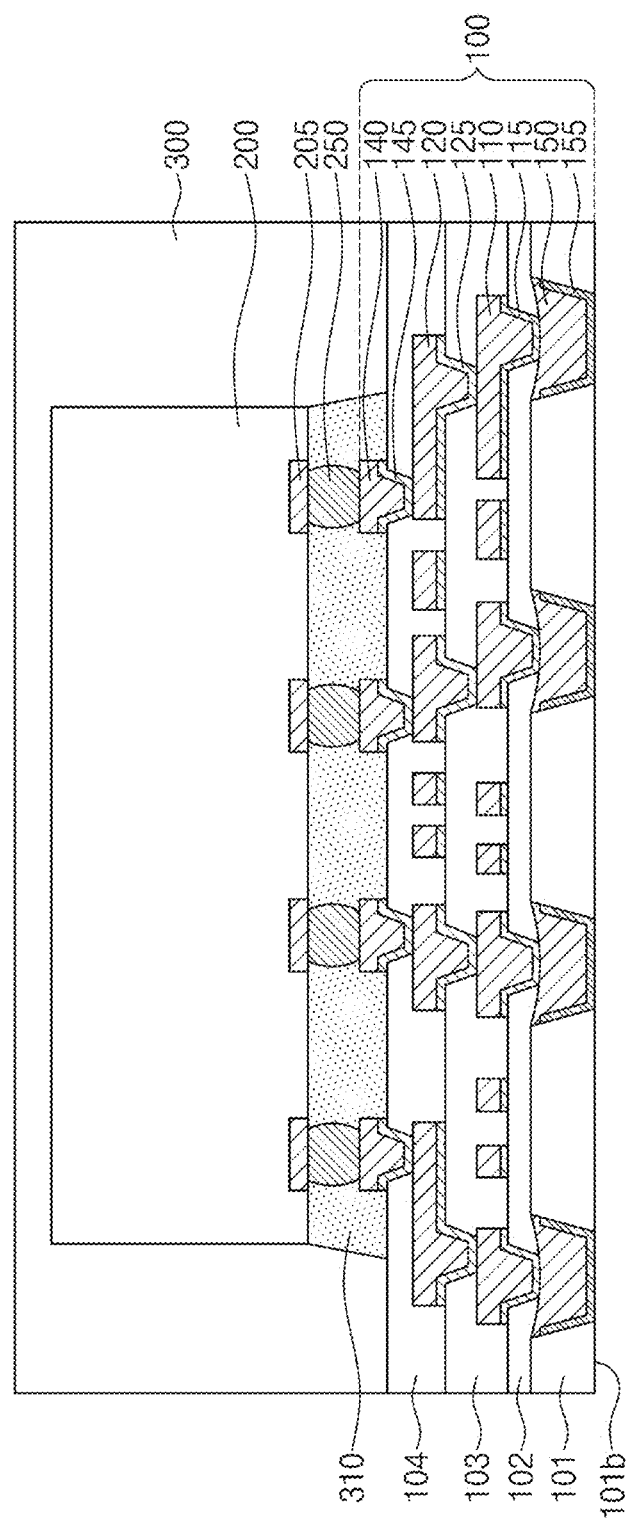

Referring to FIG. 2Q, the etch stop layer 950 may be removed to expose the under-bump seed pattern 155 and/or a bottom surface 101b of the first dielectric layer 101. The removal of the etch stop layer 950 may be performed by, for example, an etching process. A wet etching process may be adopted as the etching process.

Figure 2R:
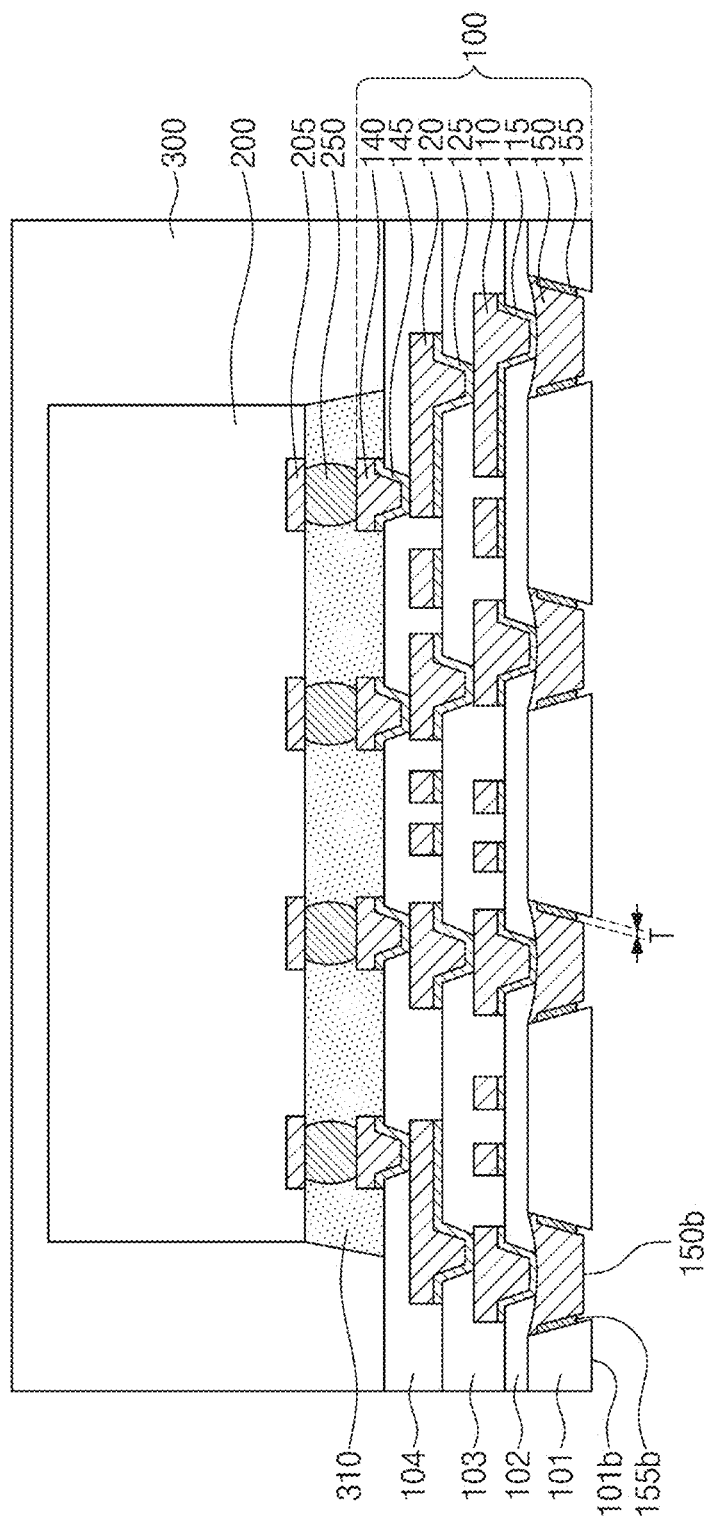

Referring to FIG. 2R, a portion of the under-bump seed pattern 155 may be removed to expose a bottom surface 150b of the under-bump pattern 150. An etching process may be performed to partially remove the under-bump seed pattern 155. A wet etching process may be adopted as the etching process. In the etching process, the under-bump pattern 150 and the first dielectric layer 101 may have their etch selectivity with respect to the under-bump seed pattern 155. Therefore, the under-bump pattern 150 and/or the first dielectric layer 101 may remain after the etching process is terminated.

The removed portion of the under-bump seed pattern 155 may be a part of the under-bump seed pattern 155 exposed on the bottom surface 101b of the first dielectric layer 101. Thus, the partial removal of the under-bump seed pattern 155 may expose the bottom surface 150b of the under-bump pattern 150. The exposed bottom surface 150b of the under-bump pattern 150 may be located at a higher level than that of the bottom surface 101b of the first dielectric layer 101. A difference in level between the bottom surface 101b of the first dielectric layer 101 and the bottom surface 150b of the under-bump pattern 150 may be the same as or similar to a thickness T of the under-bump seed pattern 155. For example, the difference in level between the bottom surface 101b of the first dielectric layer 101 and the bottom surface 150b of the under-bump pattern 150 may be about 80% to about 120% of the thickness T of the under-bump seed pattern 155.

After the etching process, the under-bump seed pattern 155 may have an undercut. The undercut of the under-bump seed pattern 155 may be formed between the under-bump pattern 150 and the first dielectric layer 101. Therefore, under-bump seed pattern 155 may have a bottom surface 155b located at a higher level than that of the bottom surface 150b of the under-bump pattern 150.

In some example embodiments, adjustment of conditions for the etching process may cause that the bottom surface 155b of the under-bump seed pattern 155 is located at substantially the same level as that of the bottom surface 150b of the under-bump pattern 150.

Differently from that shown, a single etching process may be performed to partially remove the under-bump seed pattern 155 and also to remove the etch stop layer 950 of FIG. 2Q.

Referring back to FIG. 1A, a solder terminal 500 may be formed on the exposed bottom surface 150b of the under-bump pattern 150. The formation of the solder terminal 500 may include performing a solder-ball attachment process.

A relatively small adhesive force may be provided between the solder terminal 500 and the under-bump seed pattern 155. For example, the adhesive force between the solder terminal 500 and the under-bump seed pattern 155 may be less than that between the solder terminal 500 and the under-bump pattern 150. According to some example embodiments, the solder terminal 500 may be in direct contact with the under-bump pattern 150, and thus the solder terminal 500 may be rigidly bonded to the under-bump pattern 150. Through the processes discussed above, a semiconductor package 1 may be eventually fabricated.

A single semiconductor package 1 has been illustrated and discussed for brevity of description, but the method of fabricating the semiconductor package 1 is not limited to chip-level fabrication. For example, the semiconductor package 1 may be fabricated at a chip, panel, or wafer level.

Figure 3B:
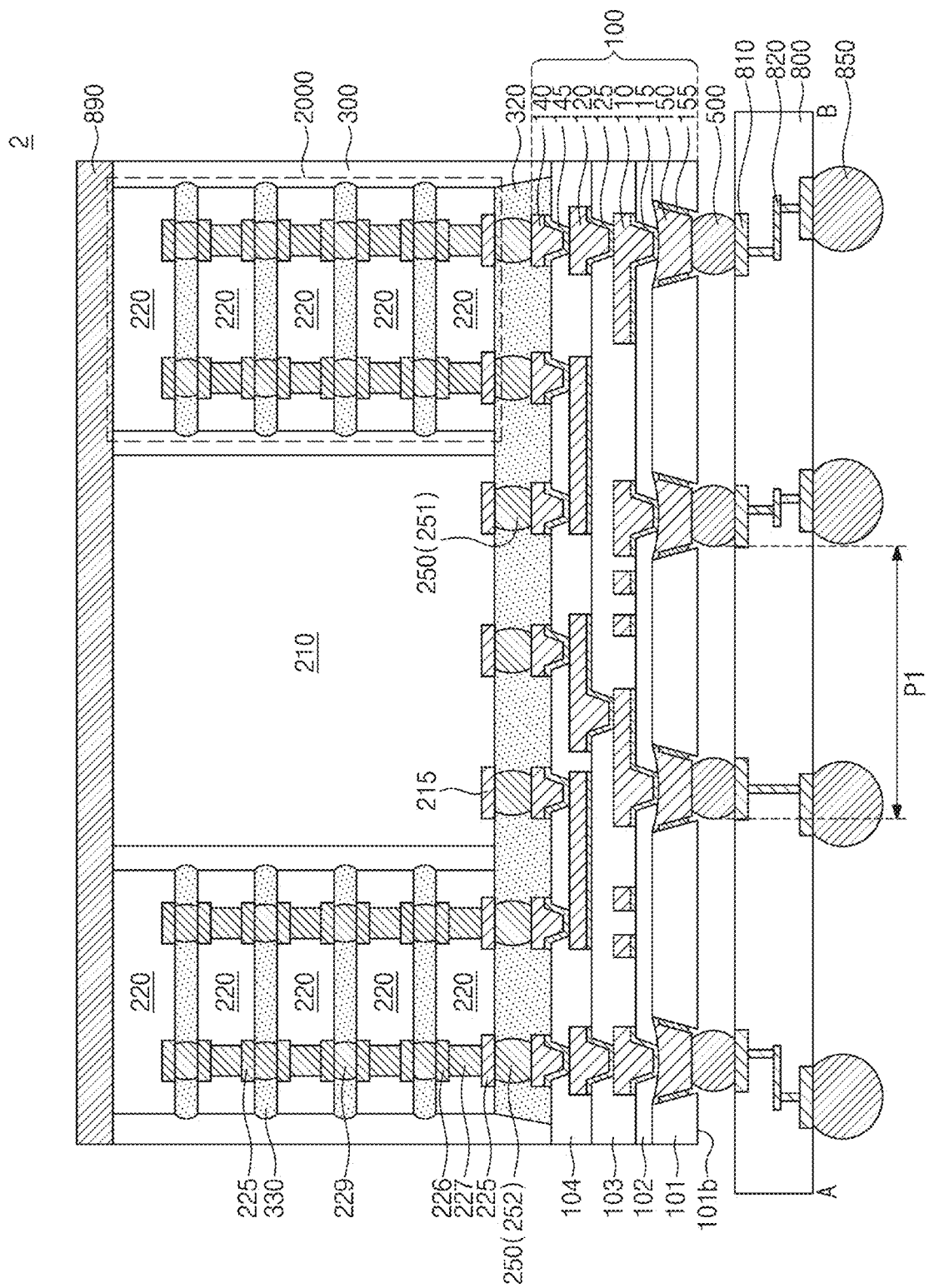
FIG. 3B illustrates a cross-sectional view taken along line A-B of FIG. 3A.

FIG. 3A illustrates a plan view showing a semiconductor package according to some example embodiments. FIG. 3B illustrates a cross-sectional view taken along line A-B of FIG. 3A. A duplicate description will be omitted below.

Referring to FIGS. 3A and 3B, a semiconductor package 2 may include a package substrate 800, a redistribution substrate 100, solder bumps 250, solder terminals 500, a first semiconductor chip 210, a chip stack 2000, and/or a molding layer 300. The solder terminals 500 and the molding layer 300 may be substantially the same as those discussed in FIGS. 1A to 1C. The solder bumps 250 may include first solder bumps 251 and second solder bumps 252.

The package substrate 800 may include a printed circuit board. The package substrate 800 may include metal lines 820 and metal pads 810. The metal lines 820 may be provided in the package substrate 800. The phrase "coupled to the package substrate 800" may mean "coupled to the metal lines 820." The metal pads 810 may be provided on a top surface of the package substrate 800 and electrically connected to the metal lines 820. External bonding terminals 850 may be provided on a bottom surface of the package substrate 800 and electrically connected to the metal lines 820. External electrical signals may be transferred through the external bonding terminals 850 to the metal lines 820. Each or one or more of the external bonding terminals 850 may have a solder-ball shape and may include a solder material.

The redistribution substrate 100 may be disposed on the package substrate 800. The redistribution substrate 100 may serve as an interposer substrate. The solder terminals 500 may be coupled to corresponding metal pads 810 of the package substrate 800. The redistribution substrate 100 may be electrically connected through the solder terminals 500 to the package substrate 800. The solder terminals 500 may have a pitch P1 less than that of the external bonding terminals 850.

The redistribution substrate 100 may be substantially the same as that discussed in FIGS. 1A to 1C. For example, the redistribution substrate 100 may include an under-bump seed pattern 155, an under-bump pattern 150, dielectric layers 101, 102, 103, and/or 104, first and/or second seed patterns 115 and 125, first and/or second redistribution patterns 110 and 120, a seed pad 145, and/or a redistribution pad 140.

The first semiconductor chip 210 may be disposed on a top surface at a central region of the redistribution substrate 100. The first semiconductor chip 210 may be substantially the same as the semiconductor chip 200 of FIGS. 1A and 1C. However, the first semiconductor chip 210 may be one of a logic chip, a buffer chip, and/or a system-on-chip (SOC). The first semiconductor chip 210 may include an application specific integrated circuit (ASIC) chip and/or an application processor (AP) chip. The ASIC chip may include an application specific integrated circuit (ASIC). Alternatively, the first semiconductor chip 210 may include a central processing unit (CPU) and/or a graphic processing unit (GPU).

The first solder bumps 251 may be provided between chip pads 215 of the first semiconductor chip 210 and corresponding redistribution pads 140. The first solder bumps 251 may have their functions and materials substantially the same as those of the solder bump 250 discussed in FIGS. 1A and 1C. The first solder bumps 251 may have a pitch less than the pitch P1 of the solder terminals 500.

The chip stack 2000 may be disposed on a top surface at an edge region of the redistribution substrate 100. The chip stack 2000 may be laterally spaced apart from the first semiconductor chip 210. The chip stack 2000 may be provided in plural, and when viewed in plan, the first semiconductor chip 210 may be disposed between the plurality of chip stacks 2000. The number of the chip stacks 2000 may be variously changed. For example, the semiconductor package 2 may include a single chip stack 2000.

Each or one or more of the chip stacks 2000 may include a plurality of stacked second semiconductor chips 220. The second semiconductor chips 220 may include integrated circuits therein. The second semiconductor chips 220 may be of a different type from the first semiconductor chip 210. For example, a lowermost second semiconductor chip 220 may be a logic chip, and remaining second semiconductor chips 220 may be memory chips. The memory chip may include a high bandwidth memory (HBM) chip. The lowermost second semiconductor chip 220 may be a logic chip whose type is different from that of the first semiconductor chip 210. For example, the lowermost second semiconductor chip 220 may be a controller chip to control the memory chips. For another example, the lowermost second semiconductor chip 220 may be a memory chip.

Each or one or more of the second semiconductor chips 220 may include lower pads 225, through electrodes 227, and/or upper pads 226. The lower pads 225 and/or the upper pads 226 may be respectively provided on a bottom surface and a top surface of the second semiconductor chip 220. The lower pads 225 and/or the upper pads 226 may be electrically connected to corresponding integrated circuits of the second semiconductor chip 220. The through electrodes 227 may be correspondingly disposed in the second semiconductor chip 220 and correspondingly coupled to the lower pads 225 and/or the upper pads 226. An uppermost second semiconductor chip 220 may include the lower pads 225, but may not include the through electrodes 227 and/or the upper pads 226. The uppermost second semiconductor chip 220 may have a thickness greater than that of any other second semiconductor chip 220.

Each or one or more of the chip stacks 2000 may further include interposer bumps 229. The interposer bumps 229 may be interposed between neighboring second semiconductor chips 220 and correspondingly coupled to the lower pads 225 and/or the upper pads 226. Therefore, the second semiconductor chips 220 may be electrically connected to each other. Each or one or more of the interposer bumps 229 may include a solder, a pillar, and/or a combination thereof. The interposer bumps 229 may include a solder material and/or copper, but the present inventive concepts are not limited thereto. In some example embodiments, the interposer bumps 229 may be omitted. In this case, the lower pads 225 of a certain second semiconductor chip 220 may be directly bonded to the upper pads 226 of other second semiconductor chip 220 that faces the certain second semiconductor chip 220.

The chip stacks 2000 may further include upper under-fill layers 330. The upper under-fill layers 330 may be provided in corresponding gaps between the second semiconductor chips 220, thereby encapsulating the interposer bumps 229. The upper under-fill layers 330 may include a dielectric polymer, such as an epoxy-based polymer.

The second solder bumps 252 may be interposed between the lowermost second semiconductor chip 220 and the redistribution substrate 100, and may be coupled to the lower pads 225 and/or corresponding redistribution pads 140. Therefore, the second semiconductor chips 220 may be electrically connected through the redistribution substrate 100 to the first semiconductor chip 210 and/or the solder terminals 500. Arrangement, functions, and/or materials of the second solder bumps 252 may be substantially the same as those of the solder bumps 250 discussed in FIGS. 1A and 1C. For example, each or one or more of the second solder bumps 252 may include a solder, a pillar, and/or any combination thereof. The second solder bumps 252 may include metal and/or a solder material, but the present inventive concepts are not limited thereto. The second solder bumps 252 may have a pitch less than the pitch P1 of the solder terminals 500.

The semiconductor package 2 may further include an under-fill pattern 320. The under-fill pattern 320 may be provided in a first gap between the redistribution substrate 100 and the first semiconductor chip 210, thereby encapsulating the first solder bumps 251. The under-fill pattern 320 may extend into second gaps between the redistribution substrate 100 and the chip stacks 2000, thereby encapsulating the second solder bumps 252. The under-fill pattern 320 may include a dielectric polymer, such as an epoxy-based polymer. Although not shown, the under-fill pattern 320 may not extend into any of the second gaps. In this case, an under-fill layer may be separately formed in each or one or more of the second gaps.

The molding layer 300 may be disposed on the redistribution substrate 100, and may cover a sidewall of the first semiconductor chip 210 and/or sidewalls of the second semiconductor chips 220. The molding layer 300 may expose a top surface of the first semiconductor chip 210 and/or a top surface of the uppermost second semiconductor chip 220. Differently from that shown, the molding layer 300 may further cover the top surface of the first semiconductor chip 210 and/or the top surface of the uppermost second semiconductor chip 220. In some example embodiments, the under-fill pattern 320 may be omitted, and the molding layer 300 may extend into the first gap and the second gaps. The molding layer 300 may include a dielectric polymer different from those of the under-fill pattern 320 and the upper under-fill layer 330.

The semiconductor package 2 may further include a thermal radiation structure 890. The thermal radiation structure 890 may be disposed on the first semiconductor chip 210, a top surface of the chip stack 2000, and/or a top surface of the molding layer 300. The thermal radiation structure 890 may extend onto a sidewall of the molding layer 300. The thermal radiation structure 890 may include a material whose thermal conductivity is high. The thermal radiation structure 890 may include a heat sink, a heat slug, and/or a thermal interface material (TIM) layer. When the semiconductor package 2 operates, the thermal radiation structure 890 may promptly externally discharge heat generated from the redistribution substrate 100, the first semiconductor chip 210, and/or the second semiconductor chips 220. The thermal radiation structure 890 may include metal, such as copper. The thermal radiation structure 890 may absorb external physical impacts to protect the first semiconductor chip 210 and/or the chip stacks 2000.

The thermal radiation structure 890 may have electrical conductivity and serve as an electromagnetic field shield layer. For example, the thermal radiation structure 890 may shield electromagnetic interference (EMI) of the first semiconductor chip 210 and/or the second semiconductor chips 220. In this case, the thermal radiation structure 890 may be electrically grounded through the redistribution substrate 100, and may reduce or prevent the first semiconductor chip 210 and/or the second semiconductor chips 220 from being electrically damaged caused by electrostatic discharge (ESD).

Figure 4:
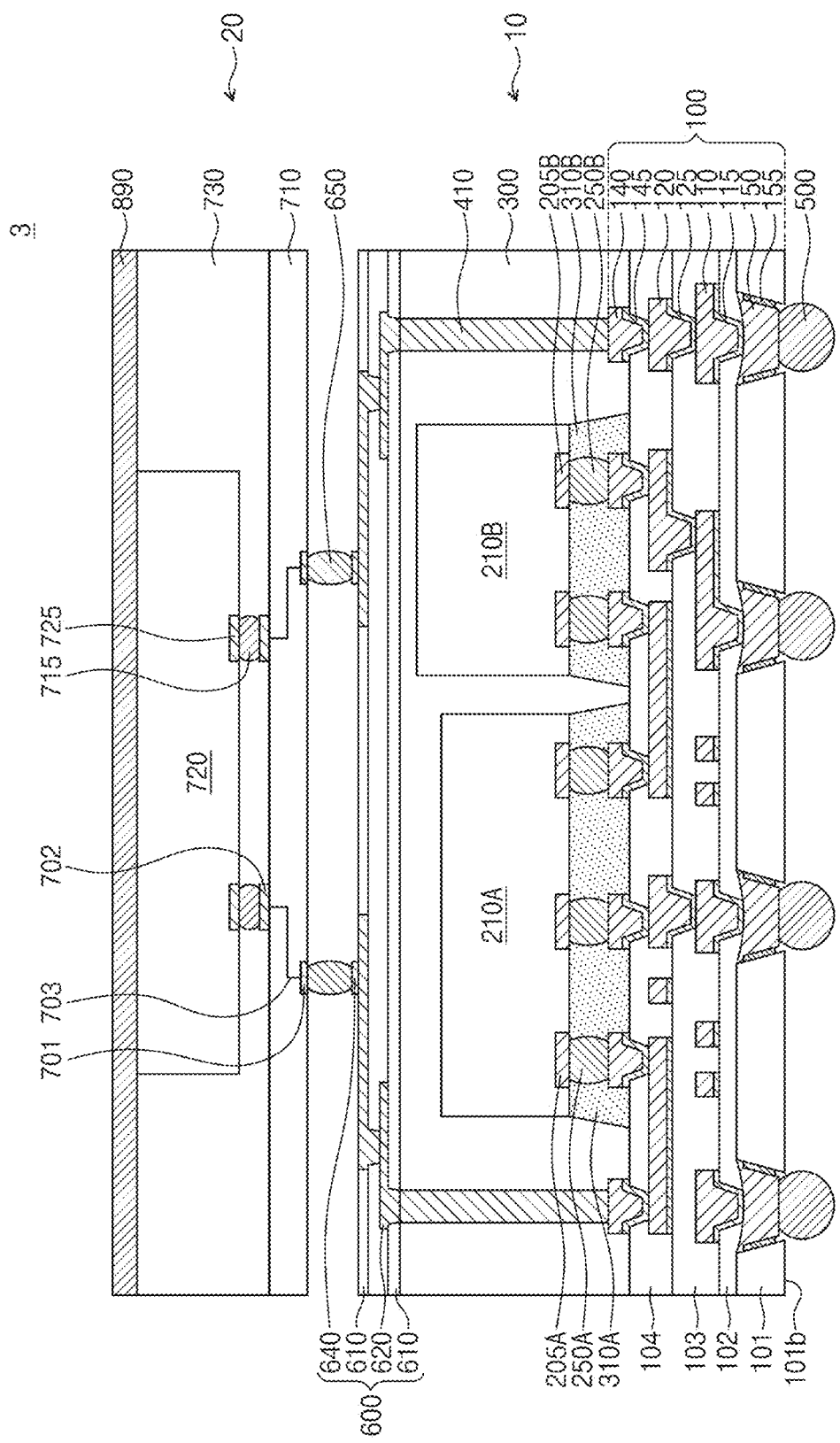
FIG. 4 illustrates a cross-sectional view showing a semiconductor package according to some example embodiments.

FIG. 4 illustrates a cross-sectional view showing a semiconductor package according to some example embodiments. A duplicate description will be omitted below.

Referring to FIG. 4, a semiconductor package 3 may include a lower package 10 and an upper package 20. The lower package 10 may include a redistribution substrate 100, solder terminals 500, a first lower semiconductor chip 210A, a second lower semiconductor chip 210B, a molding layer 300, and/or a conductive structure 410. The redistribution substrate 100, the solder terminals 500, and/or the molding layer 300 may be substantially the same as those discussed in FIGS. 1A and 1B.

The second lower semiconductor chip 210B may be laterally spaced apart from the first lower semiconductor chip 210A. The second lower semiconductor chip 210B may be of a different type from the first lower semiconductor chip 210A. For example, the first lower semiconductor chip 210A may include one of a logic chip, a memory chip, and/or a power management chip, and the second lower semiconductor chip 210B may include another of a logic chip, a memory chip, and/or a power management chip. For example, the first lower semiconductor chip 210A may be an ASIC chip, and the second lower semiconductor chip 210B may be a power management chip. Each or one or more of the first and second lower semiconductor chips 210A and 210B may be similar to the semiconductor chip 200 discussed in FIGS. 1A and 1C. Differently from that shown, the second lower semiconductor chip 210B may be omitted. Alternatively, a third semiconductor chip may further be mounted to a top surface of the redistribution substrate 100.

The lower package 10 may further include first lower solder bumps 250A and/or second lower solder bumps 250B. The first and/or second lower solder bumps 250A and 250B may be similar to the solder bumps 250 discussed in FIGS. 1A and 1C. The first lower solder bumps 250A may be interposed between the redistribution substrate 100 and the first lower semiconductor chip 210A. The first lower semiconductor chip 210A may include chip pads 205A electrically connected through the first lower solder bumps 250A to the redistribution substrate 100. The second lower solder bumps 250B may be interposed between the redistribution substrate 100 and the second lower semiconductor chip 210B. The second lower semiconductor chip 210B may include chip pads 205B electrically connected through the second lower solder bumps 250B to the redistribution substrate 100. Accordingly, the second lower semiconductor chip 210B may be electrically connected through the redistribution substrate 100 to the first lower semiconductor chip 210A.

A first under-fill layer 310A may be provided in a first gap between the redistribution substrate 100 and the first lower semiconductor chip 210A. The first under-fill layer 310A may encapsulate the first lower solder bumps 250A. A second under-fill layer 310B may be provided in a second gap between the redistribution substrate 100 and the second lower semiconductor chip 210B, thereby encapsulating the second lower solder bumps 250B. The first and second under-fill layers 310A and 310B may include a dielectric polymer, such as an epoxy-based polymer.

The conductive structure 410 may be provided on a top surface of the redistribution substrate 100 and coupled to a corresponding redistribution pad 140. The conductive structure 410 may be laterally spaced apart from the first and/or second lower semiconductor chips 210A and 210B. When viewed in plan, the conductive structure 410 may be provided on an edge region of the redistribution substrate 100. A metal pillar may be provided on the redistribution substrate 100, forming the conductive structure 410. For example, the conductive structure 410 may be a metal pillar. The conductive structure 410 may be electrically connected through the redistribution substrate 100 to the first lower semiconductor chip 210A, the second lower semiconductor chip 210B, and/or the solder terminals 500. The conductive structure 410 may include metal, such as copper.

The molding layer 300 may be disposed on the top surface of the redistribution substrate 100 and may cover the first and second lower semiconductor chips 210A and 210B. The molding layer 300 may cover sidewalls of the conductive structure 410. The molding layer 300 may be provided between the first and second lower semiconductor chips 210A and 210B, between the first lower semiconductor chip 210A and the conductive structure 410, and/or between the second lower semiconductor chip 210B and the conductive structure 410. The molding layer 300 may expose a top surface of the conductive structure 410.

The lower package 10 may further include an upper redistribution layer 600. The upper redistribution layer 600 may be provided on a top surface of the molding layer 300. The upper redistribution layer 600 may include upper dielectric layers 610, upper redistribution patterns 620, and/or upper redistribution pads 640. The upper dielectric layers 610 may be stacked on the molding layer 300. The upper dielectric layers 610 may include a photosensitive polymer. Each or one or more of the upper redistribution patterns 620 may include a via part in the upper dielectric layers 610 and/or a wiring part between the upper dielectric layers 610. The upper redistribution patterns 620 may include metal, such as copper. At least one of the upper redistribution patterns 620 may be in contact with a top surface of the conductive structure 410. Therefore, the upper redistribution patterns 620 may be coupled to the conductive structures 410. The upper redistribution pads 640 may be disposed on an uppermost one of the upper dielectric layers 610 and coupled to the upper redistribution patterns 620. The upper redistribution pads 640 may be electrically connected through the upper redistribution patterns 620 and the conductive structures 410 to the solder terminals 500, the first lower semiconductor chip 210A, and/or the second lower semiconductor chip 210B. Because the upper redistribution patterns 620 are provided, the upper redistribution pad 640 may not be vertically aligned with the conductive structure 410. Accordingly, it may be possible to increase the degree of arrangement freedom of the upper redistribution pad 640.

The upper package 20 may be disposed on the lower package 10. For example, the upper package 20 may be placed on the upper redistribution layer 600. The upper package 20 may include an upper substrate 710, an upper semiconductor chip 720, and/or an upper molding layer 730. The upper substrate 710 may be a printed circuit board. Alternatively, the upper substrate 710 may be a redistribution layer. For example, the upper substrate 710 may be manufactured similarly to the redistribution substrate 100 discussed in FIGS. 2A to 2R. A first connection pad 701 and/or a second connection pad 702 may be respectively disposed on a bottom surface and/or a top surface of the upper substrate 710. The upper substrate 710 may be provided therein with a wiring line 703 coupled to the first connection pad 701 and/or the second connection pad 702. The wiring line 703 is schematically illustrated, and may be variously changed in shape and arrangement. The first connection pad 701, the second connection pad 702, and/or the wiring line 703 may include a conductive material, such as metal.

The upper semiconductor chip 720 may be disposed on the upper substrate 710. The upper semiconductor chip 720 may include integrated circuits (not shown), and the integrated circuits may include a memory circuit, a logic circuit, and/or a combination thereof. The upper semiconductor chip 720 may be of a different type from the first and/or second lower semiconductor chips 210A and 210B. For example, the upper semiconductor chip 720 may be a memory chip. A conductive bump 715 may be interposed between the upper substrate 710 and the upper semiconductor chip 720, and may be coupled to the second connection pad 702 and/or a chip pad 725 of the upper semiconductor chip 720. The upper semiconductor chip 720 may be electrically connected to the first connection pad 701 through the conductive bump 715, and/or the wiring line 703. Although not shown, the conductive bump 715 may be omitted, and the chip pad 725 may be directly coupled to the second connection pad 702.

The upper molding layer 730 may be provided on the upper substrate 710, thereby covering the upper semiconductor chip 720. The upper molding layer 730 may exposed a top surface of the upper semiconductor chip 720, but the present inventive concepts are not limited thereto. The upper molding layer 730 may include a dielectric polymer, such as an epoxy-based polymer.

The semiconductor package 3 may further include a thermal radiation structure 890. The thermal radiation structure 890 may be disposed on a top surface of the upper molding layer 730. The thermal radiation structure 890 may extend onto a sidewall of the upper molding layer 730 and/or a sidewall of the molding layer 300.

The semiconductor package 3 may further include a connection terminal 650. The connection terminal 650 may be interposed between and coupled to the upper redistribution pad 640 and the first connection pad 701. Therefore, the upper package 20 may be electrically connected through the connection terminal 650 to the first lower semiconductor chip 210A, the second lower semiconductor chip 210B, and/or the solder terminal 500. The electrical connection of the upper package 20 may indicate an electrical connection with integrated circuits in the upper semiconductor chip 720.

In some example embodiments, the upper substrate 710 may be omitted, and the connection terminal 650 may be directly coupled to the chip pad 725 of the upper semiconductor chip 720. In this case, the upper molding layer 730 may be directly formed on a top surface of the upper redistribution layer 600. Alternatively, the upper substrate 710 and/or the connection terminal 650 may be omitted, and the chip pad 725 of the upper semiconductor chip 720 may be directly coupled to the upper redistribution pad 640.

Figure 5:
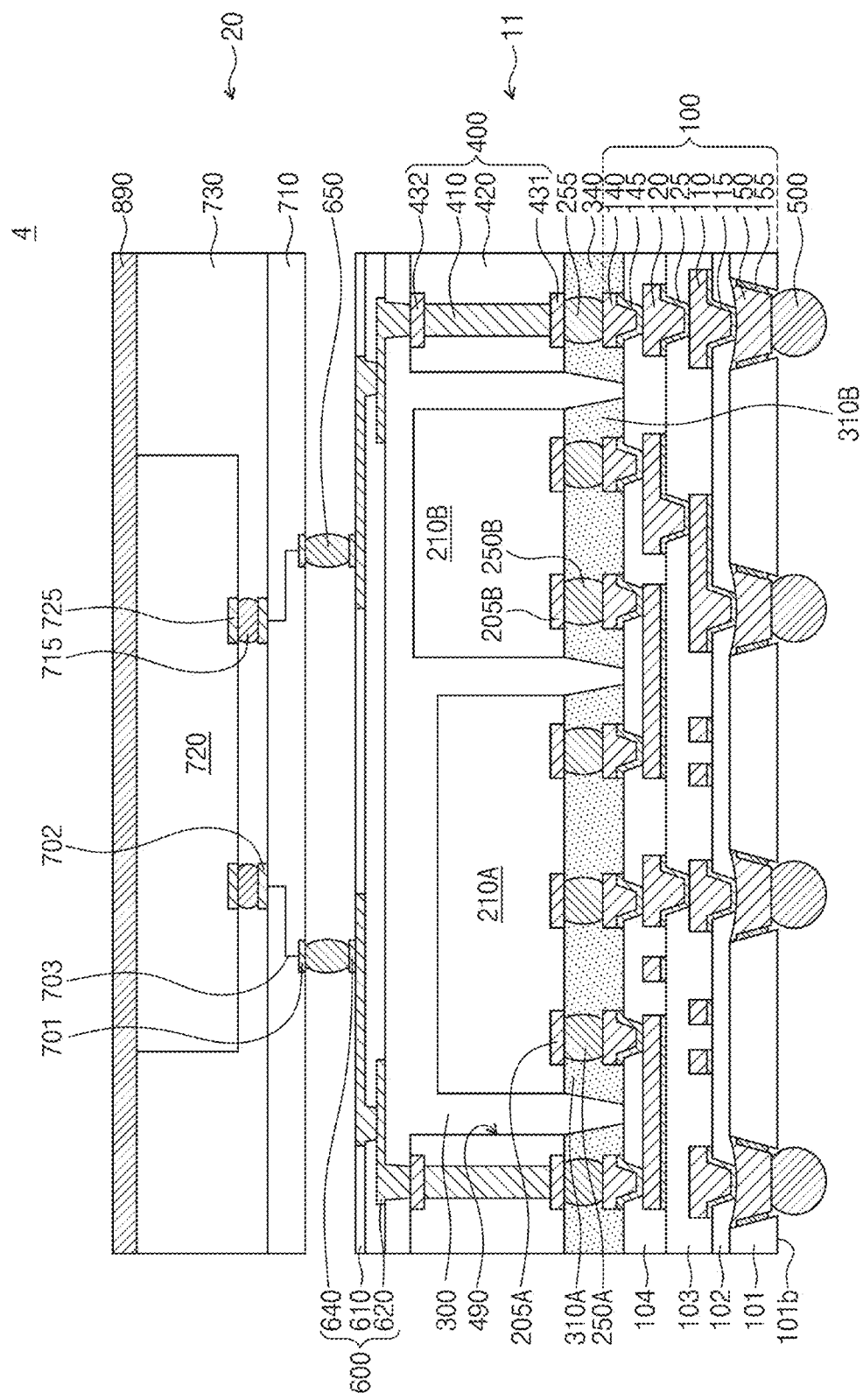
FIG. 5 illustrates a cross-sectional view showing a semiconductor package according to some example embodiments.

FIG. 5 illustrates a cross-sectional view showing a semiconductor package according to some example embodiments. A duplicate description will be omitted below.

Referring to FIG. 5, a semiconductor package 4 may include a lower package 11 and/or an upper package 20. The lower package 11 may include a redistribution substrate 100, solder terminals 500, first lower solder bumps 250A, second lower solder bumps 250B, a first lower semiconductor chip 210A, a second lower semiconductor chip 210B, a molding layer 300, and/or a connection substrate 400. The redistribution substrate 100, the solder terminals 500, and/or the molding layer 300 may be substantially the same as those discussed in FIGS. 1A and 1B. The first lower semiconductor chip 210A, the second lower semiconductor chip 210B, the first lower solder bumps 250A, and/or the second lower solder bumps 250B may be substantially the same as those discussed in FIG. 4. The lower package 11 may further include a first under-fill layer 310A and a second under-fill layer 310B.

The connection substrate 400 may be disposed on the redistribution substrate 100. The connection substrate 400 may have a substrate hole 490 that penetrates therethrough. For example, the connection substrate 400 may be manufactured by forming the substrate hole 490 that penetrates top and bottom surfaces of a printed circuit board. When viewed in plan, the substrate hole 490 may overlap a central portion of the redistribution substrate 100. The first and/or second lower semiconductor chips 210A and 210B may be disposed in the substrate hole 490 of the connection substrate 400. The first and/or second lower semiconductor chips 210A and 210B may be spaced apart from an inner sidewall of the connection substrate 400.

The connection substrate 400 may include a conductive structure 410 and/or a base layer 420. Differently from that shown, the base layer 420 may include stacked layers. The base layer 420 may include a dielectric material. For example, the base layer 420 may include a carbon-based material, a ceramic, and/or a polymer. The substrate hole 490 may penetrate the base layer 420. The conductive structure 410 may be provided in the base layer 420. The conductive structure 410 may be a metal pillar. The connection substrate 400 may further include a first pad 431 and/or a second pad 432. The first pad 431 may be disposed on a bottom surface of the conductive structure 410. The second pad 432 may be disposed on a top surface of the conductive structure 410. The second pad 432 may be electrically connected through the conductive structure 410 to the first pad 431. The conductive structure 410, the first pad 431, and/or the second pad 432 may include, for example, copper, aluminum, tungsten, titanium, tantalum, iron, and/or any alloy thereof.

A connection bump 255 may be disposed between the redistribution substrate 100 and the connection substrate 400. The connection bump 255 may be interposed between and coupled to the first pad 431 and a corresponding redistribution pad 140. The conductive structure 410 may be electrically connected through the connection bump 255 to the redistribution substrate 100. The connection bump 255 may include one or more of a solder ball, a bump, and/or a pillar. The connection bump 255 may include a metallic material. A third under-fill layer 340 may be provided in a gap between the redistribution substrate 100 and the connection substrate 400, thereby encapsulating the connection bump 255. The third under-fill layer 340 may include a dielectric polymer.

The molding layer 300 may be provided on the first lower semiconductor chip 210A, the second lower semiconductor chip 210B, and/or the connection substrate 400. The molding layer 300 may extend between the first lower semiconductor chip 210A and the second lower semiconductor chip 210B, between the first lower semiconductor chip 210A and the connection substrate 400, and/or between the second lower semiconductor chip 210B and the connection substrate 400. According to some example embodiments, an adhesive dielectric film may be attached to a top surface of the connection substrate 400, top surfaces of the first and second lower semiconductor chips 210A and 210B, and/or sidewalls of the first and second lower semiconductor chips 210A and 210B, with the result that the molding layer 300 may be formed. For example, an Ajinomoto build-up film (ABF) may be used as the adhesive dielectric film. For another example, the molding layer 300 may include a dielectric polymer, such as an epoxy-based polymer. For another example, the first and/or second under-fill layers 310A and 310B may be omitted, and the molding layer 300 may extend onto a bottom surface of the first lower semiconductor chip 210A and/or a bottom surface of the second lower semiconductor chip 210B. When the third under-fill layer 340 is omitted, the molding layer 300 may extend into a gap between the redistribution substrate 100 and the connection substrate 400.

The lower package 11 may further include an upper redistribution layer 600. The upper redistribution layer 600 may be disposed on the molding layer 300 and/or the connection substrate 400. The upper redistribution layer 600 may include upper dielectric layers 610, upper redistribution patterns 620, and/or upper redistribution pads 640. The upper dielectric layers 610, the upper redistribution patterns 620, and/or the upper redistribution pads 640 may be substantially the same as those discussed above in FIG. 4. In contrast, at least one of the upper redistribution patterns 620 may extend into the molding layer 300, and may thus be coupled to the second pad 432.

The upper package 20 may be disposed on the lower package 11. For example, the upper package 20 may be placed on the upper redistribution layer 600. The upper package 20 may include an upper substrate 710, an upper semiconductor chip 720, and/or an upper molding layer 730. The upper package 20 may further include a thermal radiation structure 890.

The semiconductor package 4 may further include a connection terminal 650. The connection terminal 650 may be interposed between the lower package 10 and the upper package 20.

According to the present inventive concepts, an under-bump pattern may be formed in an opening that is defined by a dielectric layer. Redistribution patterns may have reduced or no undulations on top surfaces thereof. Therefore, good electrical connection may be provided between the redistribution patterns. A semiconductor package may exhibit improved reliability.

An under-bump seed pattern may cover a sidewall of the under-bump pattern, and thus the under-bump pattern may be reduced or prevented from damage.

This detailed description of the present inventive concepts should not be construed as limited to the example embodiments set forth herein, and it is intended that the present inventive concepts cover the various combinations, the modifications and variations of this invention without departing from the spirit and scope of the present inventive concepts.

What is claimed is:
1. A semiconductor package, comprising:
a redistribution substrate;
a semiconductor chip on a top surface of the redistribution substrate; and
a solder terminal on a bottom surface of the redistribution substrate,
wherein the redistribution substrate includes:
an under-bump pattern in contact with the solder terminal;
a dielectric layer on a sidewall of the under-bump pattern;
an under-bump seed pattern between the dielectric layer and the sidewall of the under-bump pattern, the under-bump seed pattern exposing a bottom surface of the under-bump pattern; and
a redistribution pattern on the under-bump pattern,
wherein the under-bump pattern has a central region and an edge region when viewed in plan,
wherein a first top surface of the under-bump pattern at the edge region of the under-bump pattern is at a level higher than a level of a second top surface of the under-bump pattern at the central region of the under-bump pattern, and
wherein an angle between the bottom surface and the sidewall of the under-bump pattern is in a range of 110° to 140°.
2. The semiconductor package of claim 1, wherein the first top surface of the under-bump pattern is at a level different from a level of a top surface of the under-bump seed pattern.

3. The semiconductor package of claim 2, wherein the level of the first top surface of the under-bump pattern is higher than the level of the top surface of the under-bump seed pattern.

4. The semiconductor package of claim 2, wherein the level of the first top surface of the under-bump pattern is lower than the level of the top surface of the under-bump seed pattern.

5. The semiconductor package of claim 1, wherein the dielectric layer exposes a bottom surface of the under-bump seed pattern,
wherein the bottom surface of the under-bump seed pattern is at a level higher than a level of the bottom surface of the under-bump pattern.

6. The semiconductor package of claim 5, wherein the solder terminal is in direct contact with the bottom surface of the under-bump pattern.

7. A semiconductor package, comprising:
a redistribution substrate;
a semiconductor chip on a top surface of the redistribution substrate; and
a solder terminal on a bottom surface of the redistribution substrate,
wherein the redistribution substrate includes:
an under-bump pattern;
a dielectric layer on a sidewall of the under-bump pattern;
an under-bump seed pattern between the dielectric layer and the sidewall of the under-bump pattern; and
a redistribution pattern on a top surface of the under-bump pattern,
wherein the solder terminal is on a bottom surface of the under-bump pattern,
wherein the bottom surface of the under-bump pattern is at a level higher than a level of a bottom surface of the dielectric layer,
wherein a first angle between the bottom surface and the sidewall of the under-bump pattern is an obtuse angle, and
wherein the under-bump seed pattern does not extend onto any of a top surface of the dielectric layer and the bottom surface of the under-bump pattern.

8. The semiconductor package of claim 7, wherein the first angle ranges from 110° to 140°.

9. The semiconductor package of claim 7, wherein a difference between the level of the bottom surface of the under-bump pattern and the level of the bottom surface of the dielectric layer is 80% to 120% of a thickness of the under-bump seed pattern.

10. The semiconductor package of claim 7, wherein the top surface of the under-bump pattern has a downwardly convex shape.

11. The semiconductor package of claim 7, wherein the under-bump pattern extends onto a top surface of the under-bump seed pattern.

12. The semiconductor package of claim 7, wherein
the top surface of the under-bump pattern is at a level the same as or lower than a level of a top surface of the under-bump seed pattern, and
the dielectric layer covers the top surface of the under-bump seed pattern.

13. The semiconductor package of claim 7, wherein the redistribution pattern includes a wiring part and a via part between the wiring part and the under-bump pattern,
wherein a thickness of the under-bump pattern is greater than a thickness of the wiring part.

14. A semiconductor package, comprising:
a redistribution substrate;
a first semiconductor chip on a top surface of the redistribution substrate;
a plurality of bumps between the redistribution substrate and the first semiconductor chip; and
a solder terminal on a bottom surface of the redistribution substrate,
wherein the redistribution substrate includes:
an under-bump pattern;
a dielectric layer on a sidewall of the under-bump pattern;
an under-bump seed pattern between the dielectric layer and the sidewall of the under-bump pattern, the under-bump seed pattern exposing a bottom surface of the under-bump pattern;
a first redistribution pattern on the under-bump pattern, the first redistribution pattern including a first via part and a first wiring part, the first via part being between the under-bump pattern and the first wiring part; and
a second redistribution pattern on the first redistribution pattern, the second redistribution pattern including a second via part and a second wiring part,
wherein a thickness of the under-bump pattern is greater than a thickness of the first wiring part and a thickness of the second wiring part,
wherein the under-bump pattern has a central region and an edge region when viewed in plan,
wherein a first top surface at the edge region of the under-bump pattern is at a level higher than a level of a second top surface at the central region of the under-bump pattern,
wherein the bottom surface of the under-bump pattern is at a level higher than a level of a bottom surface of the dielectric layer,
wherein an angle between the bottom surface of the under-bump pattern and the sidewall of the under-bump pattern is in a range of 110° to 140°,
wherein the solder terminal is on the bottom surface of the under-bump pattern, and
wherein the under-bump pattern does not extend onto a top surface of the dielectric layer.

15. The semiconductor package of claim 14, wherein a bottom surface of the under-bump seed pattern is at a level the same as or higher than the level of the bottom surface of the under-bump pattern.

16. The semiconductor package of claim 14, further comprising a chip stack mounted on the top surface of the redistribution substrate and laterally spaced apart from the first semiconductor chip,
wherein the chip stack includes a plurality of stacked second semiconductor chips.

17. The semiconductor package of claim 14, wherein
the under-bump pattern extends onto a top surface of the under-bump seed pattern, and
the level of the first top surface of the under-bump pattern is higher than a level of the top surface of the under-bump seed pattern.

18. The semiconductor package of claim 14, further comprising:
a molding layer on the redistribution substrate, the molding layer covering the first semiconductor chip;
an upper redistribution layer on the molding layer; and a conductive structure between the redistribution substrate and the upper redistribution layer, the conductive structure being laterally spaced apart from the first semiconductor chip.

19. The semiconductor package of claim 14, further comprising:

a thermal radiation structure on the first semiconductor chip.

20. The semiconductor package of claim 14, further comprising:

an upper package on the first semiconductor chip, the upper package including an upper substrate, an upper semiconductor chip, and an upper molding layer, wherein the upper semiconductor chip is electrically connected to the second redistribution pattern via a conductive structure.

* * * * *